US009966331B2

(12) United States Patent
Ota et al.

(10) Patent No.: US 9,966,331 B2
(45) Date of Patent: May 8, 2018

(54) WIRING SUBSTRATE AND SEMICONDUCTOR DEVICE

(71) Applicant: Shinko Electric Industries Co., Ltd., Nagano-shi, Nagano-ken (JP)

(72) Inventors: Takayuki Ota, Nagano (JP); Hiroharu Yanagisawa, Nagano (JP); Katsuya Fukase, Nagano (JP)

(73) Assignee: Shinko Electric Industries Co., Ltd., Nagano-shi, Nagano-ken (JP)

( * ) Notice: Subject to any disclaimer, the term of this patent is extended or adjusted under 35 U.S.C. 154(b) by 0 days. days.

(21) Appl. No.: 15/056,515

(22) Filed: Feb. 29, 2016

(65) Prior Publication Data

US 2016/0276255 A1 Sep. 22, 2016

(30) Foreign Application Priority Data

Mar. 20, 2015 (JP) .................. 2015-058415

(51) Int. Cl.
*H01L 23/498* (2006.01)
*H01L 25/10* (2006.01)

(52) U.S. Cl.
CPC .. *H01L 23/49816* (2013.01); *H01L 23/49822* (2013.01); *H01L 23/49827* (2013.01); *H01L 25/105* (2013.01); *H01L 2224/73204* (2013.01); *H01L 2924/15311* (2013.01)

(58) Field of Classification Search
CPC ..... H01L 23/498; H01L 23/522; H01L 24/10; H01L 24/11; H01L 24/12; H01L 24/13; H01L 24/14; H01L 2224/73204; H01L 23/49822; H01L 23/49816; H01L 23/49827; H01K 1/111; H01K 1/14

USPC .......................................... 174/261; 257/737
See application file for complete search history.

(56) References Cited

U.S. PATENT DOCUMENTS

| 6,555,208 | B2 * | 4/2003 | Takada | H01L 23/49816 |
| | | | | 174/255 |
| 7,566,834 | B2 * | 7/2009 | Shimoto | H01L 21/4857 |
| | | | | 174/250 |
| 7,932,170 | B1 * | 4/2011 | Huemoeller | H01L 21/4853 |
| | | | | 257/737 |
| 7,943,863 | B2 * | 5/2011 | Nakamura | H01L 21/4853 |
| | | | | 174/255 |

(Continued)

FOREIGN PATENT DOCUMENTS

| JP | 2005-327780 | 11/2005 |
| JP | 2007-103878 | 4/2007 |

*Primary Examiner* — Antonio Crite
(74) *Attorney, Agent, or Firm* — Fish & Richardson P.C.

(57) ABSTRACT

The wiring substrate includes an insulation layer that includes a lower surface, an upper surface, and an intermediate surface located between the lower surface and the upper surface. A first wiring layer is formed on the lower surface of the insulation layer. A second wiring layer is formed on the intermediate surface of the insulation layer. A recess is formed in the upper surface of the insulation layer. The recess overlaps, in a plan view, a first through hole that extends through the insulation layer. The first through hole is filled with a via wiring, which is formed integrally with the first wiring layer. A bump is formed integrally with the via wiring and projected into the recess. An upper end surface of the bump is located above an upper surface of the second wiring layer.

10 Claims, 16 Drawing Sheets

(56) References Cited

U.S. PATENT DOCUMENTS

2010/0264552 A1* 10/2010 Nakasato ............ H01L 21/6835
                                                    257/778
2011/0024176 A1*  2/2011 Ko ..................... H01L 21/4857
                                                    174/261
2012/0111728 A1*  5/2012 Cho .................... H01L 21/4857
                                                    205/67
2013/0008705 A1*  1/2013 Tseng ................... H05K 1/111
                                                    174/266

* cited by examiner (Related Art)

WIRING SUBSTRATE AND SEMICONDUCTOR DEVICE

CROSS-REFERENCE TO RELATED APPLICATIONS

This application is based upon and claims the benefit of priority from prior Japanese Patent Application No. 2015-058415, filed on Mar. 20, 2015, the entire contents of which are incorporated herein by reference.

FIELD

This disclosure relates to a wiring substrate, a semiconductor device, and a method for manufacturing a wiring substrate.

BACKGROUND

Flip-chip mounting is one method for mounting a semiconductor element on a wiring substrate. In flip-chip mounting, the semiconductor element is connected to the wiring substrate, for example, by bumps formed on pads of the wiring substrate. An example of a method for manufacturing bumps will now be described.

As illustrated in FIG. 18A, a wiring substrate includes an insulation layer 100 and pads 101, which are embedded in the insulation layer 100. The insulation layer 100 covers the entire side surfaces of the pads 101. The insulation layer 100 also includes an upper surface 100A, which is substantially flush with upper surfaces 101A of the pads 101.

As illustrated in FIG. 18B, a resist layer 102 is formed on the upper surface 100A of the insulation layer 100. The resist layer 102 includes openings 102X, which partially expose the upper surfaces 101A of the pads 101. Then, an electrolytic plating process is performed using the resist layer 102 as a plating mask to form bumps 103 on the pads 101 exposed from the openings 102X.

As illustrated in FIG. 18C, the resist layer 102, which is illustrated in FIG. 18B, is removed. The above steps form the bumps 103 on the pads 101.

Japanese Laid-Open Patent Publication Nos. 2007-103878 and 2005-327780 describe the structure of such bumps.

As illustrated in FIG. 18C, the bumps 103 are projected from the upper surface 100A of the insulation layer 100 and entirely exposed to the exterior. Thus, the bumps 103 easily receive external force such as contact force and may be deformed by the external force prior to the mounting of a semiconductor element. The deformation of the bumps 103 may adversely affect the connection reliability between connection terminals of the semiconductor element and the bumps 103.

SUMMARY

One aspect of this disclosure is a wiring substrate. The wiring substrate includes an insulation layer, a first wiring layer, a second wiring layer, a recess, a first through hole, and a connection terminal. The insulation layer includes a lower surface, an upper surface, and an intermediate surface located between the lower surface and the upper surface. The first wiring layer is formed on the lower surface of the insulation layer. The second wiring layer is formed on the intermediate surface of the insulation layer and serves as an uppermost wiring layer. The recess is formed in the upper surface of the insulation layer. The first through hole extends through the insulation layer in a thickness-wise direction. The recess overlaps the first through hole in a plan view. The connection terminal includes a via wiring and a bump. The via wiring is formed integrally with the first wiring layer. The first through hole is filled with the via wiring. The bump is formed integrally with the via wiring. The bump is projected into the recess and exposed to the exterior. An upper end surface of the bump is located above an upper surface of the second wiring layer.

Other aspects and advantages of this disclosure will become apparent from the following description, taken in conjunction with the accompanying drawings, illustrating by way of example the principles of the invention.

It is to be understood that both the foregoing general description and the following detailed description are exemplary and explanatory and are not restrictive of the invention, as claimed.

BRIEF DESCRIPTION OF THE DRAWINGS

The embodiments, together with objects and advantages thereof, may best be understood by reference to the following description of the presently preferred embodiments together with the accompanying drawings in which.

DESCRIPTION OF THE EMBODIMENTS

Figure 1:
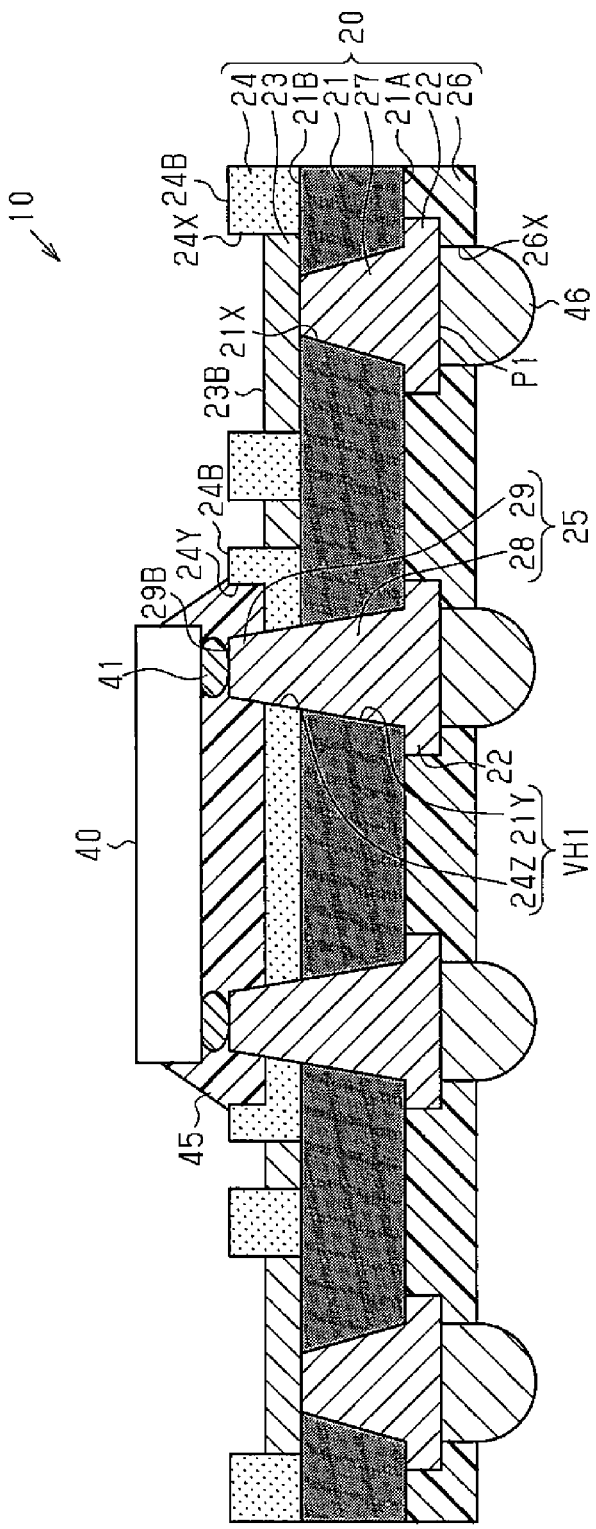
FIG. 1 is a schematic cross-sectional view illustrating a semiconductor device including a first embodiment of a wiring substrate.

Embodiments will now be described with reference to the accompanying drawings. Elements in the drawings may be partially enlarged for simplicity and clarity and have not necessarily been drawn to scale. To facilitate understanding, hatching lines may not be illustrated or be replaced by shadings in the cross-sectional drawings.

First Embodiment

A first embodiment will now be described with reference to FIGS. 1 to 4D.

As illustrated in FIG. 1, a semiconductor device 10 includes a wiring substrate 20, one or more semiconductor elements 40 (FIG. 1 illustrates only one) mounted on the wiring substrate 20, an underfill resin 45, and external connection terminals 46.

The wiring substrate 20 includes an insulation layer 21, a wiring layer 22 formed on a first surface 21A (here, lower surface) of the insulation layer 21, and a wiring layer 23 formed on a second surface 21B (here, upper surface) of the insulation layer 21. The wiring layer 23 serves as an outermost wiring layer (here, uppermost wiring layer). The wiring substrate 20 also includes an insulation layer 24 formed on the second surface 21B of the insulation layer 21, connection terminals 25, which extend through the insulation layers 21, 24 in the thickness-wise direction, and a solder resist layer 26, which is stacked on the first surface 21A of the insulation layer 21. The material of the wiring layers 22, 23 may be, for example, copper (Cu) or an alloy of copper.

The insulation layer 21 is located at an intermediate position of the wiring substrate 20 in the thickness-wise direction. The insulation layer 21 has, for example, a higher elasticity than the insulation layer 24. It is preferred that the insulation layer 21 be highly insulative to obtain high dielectric strength, for example, between the wiring layer 22 and the wiring layer 23. It is preferred that the material of the insulation layer 21 be adjusted to have a relatively small thermal expansion coefficient (e.g., approximately 3 to 20 ppm/° C.). Additionally, it is preferred that the material of the insulation layer 21 be adjusted to have a relatively high glass-transition temperature Tg (e.g., approximately 150° C. to 400° C.). Further, it is preferred that the material of the insulation layer 21 have, for example, a higher viscosity (e.g., approximately 2000 Pa·S) than the insulation layer 24. The material of the insulation layer 21 may be, for example, an insulative resin, which may be an epoxy resin or a polyimide resin, or a resin material obtained by mixing filler such as silica or alumina into the insulative resin. Alternatively, the material of the insulation layer 21 may be an insulative resin containing a reinforcement material. The insulative resin containing a reinforcement material may be obtained, for example, by impregnating a reinforcement material such as a woven cloth or a non-woven cloth of glass, aramid, or liquid crystal polymer (LCP) fibers with an epoxy or polyimide thermosetting resin. The physical properties (e.g., thermal expansion coefficient and glass-transition temperature) of the insulation layer 21 may be adjusted in accordance with the amount of the contained filler, application of the reinforcement material, or the like.

Through holes 21X and through holes 21Y are arranged in predetermined portions of the first surface 21A of the insulation layer 21. The through holes 21X extend through the insulation layer 21 in the thickness-wise direction to partially expose a first surface (here, lower surface) of the wiring layer 23. In the same manner, the through holes 21Y extend through the insulation layer 21 in the thickness-wise direction. The through holes 21Y are arranged so that, for example, a mount region where the semiconductor element 40 is mounted on the wiring substrate 20 overlaps the through holes 21Y in a plan view. The through holes 21X, 21Y are each tapered so that the diameter is decreased from a lower side (side proximate to wiring layer 22) toward an upper side (side proximate to wiring layer 23) in FIG. 1. The through holes 21X, 21Y each have, for example, an upper diameter and a lower diameter, which is larger than the upper diameter. The through holes 21X, 21Y are each shaped as, for example, a truncated cone.

Via wirings 27 are formed in the through holes 21X to electrically connect the wiring layer 22 and the wiring layer 23. The via wirings 27 are formed integrally with the wiring layer 22. The via wirings 27, for example, fill the through holes 21X. Thus, in the same manner as the through holes 21X, the via wirings 27 are each tapered so that the diameter is decreased from the lower side toward the upper side in FIG. 1. The via wirings 27 are each shaped as, for example, a truncated cone and have an upper end surface and a lower end surface, which is larger than the upper end surface. The material of the via wirings 27 may be, for example, copper or an alloy of copper.

The insulation layer 24 is formed on the second surface 21B of the insulation layer 21. The insulation layer 24 is in contact with side surfaces of the wiring layer 23 and covers the entire side surfaces of the wiring layer 23. The insulation layer 24 covers the entire second surface 21B of the insulation layer 21 exposed from the wiring layer 23. In other words, the insulation layer 24 includes openings 24X, which entirely expose a second surface 23B (here, upper surface) of the wiring layer 23. Thus, the wiring layer 23 is formed on bottom surfaces of recesses formed by the openings 24X and the second surface 21B of the insulation layer 21.

The insulation layer 24 is thicker than the wiring layer 23. Thus, the second surface 23B of the wiring layer 23 is located below the second surface 24B of the insulation layer 24.

The insulation layer 24 includes a recess 24Y located in a predetermined portion of the second surface 24B of the insulation layer 24. The recess 24Y is recessed from the second surface 24B of the insulation layer 24 toward the wiring layer 22. The recess 24Y is located in the region where the semiconductor element 40 is mounted. The recess 24Y is formed, for example, by thinning a portion of the insulation layer 24 that corresponds to the mount region compared to the other portion of the insulation layer 24. Through holes 24Z extend through predetermined thinned portions of the insulation layer 24 in the thickness-wise direction. The through holes 24Z are respectively in communication with the through holes 21Y in the insulation layer 21. For example, a wall surface defining each through hole 21Y is continuous with a wall surface defining the corresponding through hole 24Z. The in-communication through holes 21Y, 24Z each define a through hole VH1, which extends through the insulation layers 21, 24 in the thickness-wise direction. The recess 24Y, which is formed in the mount region, overlaps the through holes VH1 in a plan view. The through holes VH1 are each tapered so that the diameter is decreased from the lower side toward the upper side in FIG. 1. The through holes VH1 each have, for example, an upper diameter and a lower diameter, which is larger than the upper diameter. The through holes VH1 are each shaped as, for example, a truncated cone.

The insulation layer 24 has, for example, a lower elasticity than the insulation layer 21. It is preferred that the insulation layer 24 be highly insulative to obtain high dielectric strength, for example, between the wiring layer 22 and the wiring layer 23. It is also preferred that the insulation layer 24 have, for example, a higher adhesion than the insulation layer 21 relative to the wiring layer 23. It is preferred that the material of the insulation layer 24 have, for example, a lower viscosity (e.g., approximately 500 Pa·S) than the insulation layer 21. The material of the insulation layer 24 may be, for example, an insulative resin, which may be an epoxy resin or a polyimide resin, or a resin material obtained by mixing a filler such as silica or alumina into the insulative resin. The physical properties (e.g., viscosity) of the insulation layer 24 may be adjusted in accordance with the amount of the contained filler or the like.

The connection terminals 25 are formed integrally with the wiring layer 22 and embedded in the through holes VH1. The connection terminals 25 each include a via wiring 28 and a bump 29. The through holes VH1 are filled with the via wirings 28, which are formed integrally with the wiring layer 22. The bumps 29, which are formed integrally with the via wirings 28, are located in the recess 24Y and exposed to the exterior.

In the same manner as the through holes VH1, the via wirings 28 are each tapered so that the diameter is decreased from the lower side (side proximate to first surface 21A of insulation layer 21) toward the upper side (side proximate to second surface 24B of insulation layer 24) in FIG. 1.

The bumps 29 project from the through holes VH1 into the recess 24Y. More specifically, the bumps 29 project from the bottom surface of the recess 24Y into the recess 24Y. The bumps 29 project upward above the second surface 23B of the wiring layer 23. In the same manner as the via wirings 28, the bumps 29 are tapered from the lower side toward the upper side (side proximate to second surface 24B of insulation layer 24) in FIG. 1.

In the present embodiment, each via wiring 28 and the corresponding bump 29 are tapered so that the diameter is continuously decreased from the lower side toward the upper side in FIG. 1. Additionally, in each connection terminal 25, the circumferential surface (side surface) of the via wiring 28 and the circumferential surface (side surface) of the bump 29 are continuous and linear in a cross-sectional view.

The side surfaces of the bumps 29 are not in contact with the insulation layer 24 and not directly covered by the insulation layer 24. This exposes the side surface and an upper end surface 29B of each bump 29 to the exterior. The bumps 29 are arranged in the recess 24Y. Thus, the insulation layer 24, which includes side walls defining the recess 24Y, is located on a position separated from the bumps 29 in a planar direction (i.e., sideward direction orthogonal to the stacking direction of the insulation layers 21, 24 in a cross-sectional view).

The upper end surface 29B of each bump 29 is, for example, circular in a plan view. The upper end surface 29B is flat. Thus, the upper end surface 29B (flat surface) serves as a distal portion of the bump 29. The upper end surfaces 29B of the bumps 29 and the second surface 24B of the insulation layer 24 are located on substantially the same plane. Thus, the upper end surfaces 29B of the bumps 29 are located above the second surface 23B of the wiring layer 23.

If necessary, a surface-processed layer may be formed on a surface (upper end surface 29B and side surface or only upper end surface 29B) of each connection terminal 25 (i.e., bump 29) exposed from the insulation layer 24. In the same manner, a surface-processed layer may be formed on the second surface 23B of the wiring layer 23. Examples of the surface-processed layer are a gold (Au) layer, a nickel (Ni) layer/an Au layer (metal layer in which Ni layer and Au layer are sequentially stacked), and a Ni layer/a palladium (Pd) layer/an Au layer (metal layer in which Ni layer, Pd layer, and Au layer are sequentially stacked). The Ni layer, the Au layer, and the Pd layer may be, for example, an electroless plating metal layer formed through an electroless plating process. The Ni layer is a metal layer formed from Ni or an alloy of Ni. The Au layer is a metal layer formed from Au or an alloy of Au. The Pd layer is a metal layer formed from Pd or an alloy of Pd. Additionally, a surface-processed layer may be formed on the surfaces of the bumps 29 and the second surface 23B of the wiring layer 23 through an anti-oxidization process such as an organic solderability preservative (OSP) process.

The solder resist layer 26 is stacked on the first surface 21A of the insulation layer 21 to cover the wiring layer 22. The material of the solder resist layer 26 may be, for example, an insulative resin such as an epoxy resin or an acrylic resin.

The solder resist layer 26 includes openings 26X, which expose portions of the wiring layer 22 as external connection pads P1. The external connection pads P1 are connected to the external connection terminals 46, which may be solder balls or lead pins. The external connection terminals 46 are used when mounting the wiring substrate 20 on a mount substrate such as a motherboard. If necessary, a surface-processed layer may be formed on the wiring layer 22 exposed from the openings 26X. Examples of the surface-processed layer are an Au layer, an Ni layer/an Au layer, and an Ni layer/a Pd layer/an Au layer. Additionally, a surface-processed layer may be formed on the wiring layer 22 exposed from the openings 26X through an anti-oxidization process such as the OSP process. Alternatively, the wiring layer 22 exposed from the openings 26X may serve as an external connection terminal. When a surface-processed layer is formed on the wiring layer 22, the surface-processed layer may serve as an external connection terminal.

The semiconductor element 40 is flip-chip-mounted on the wiring substrate 20. In the present embodiment, connection terminals 41 are arranged on a circuit formation surface (here, lower surface) of the semiconductor element 40. When the connection terminals 41 are bonded to the bumps 29 of the wiring substrate 20, the semiconductor element 40 is electrically connected to the wiring layer 22 by the connection terminals 41 and the connection terminals 25.

The semiconductor element 40 may be, for example, a logic chip such as a central processing unit (CPU) chip or a graphics processing unit (GPU) chip. Additionally, the semiconductor element 40 may be, for example, a memory chip such as a dynamic random access memory (DRAM) chip, a static random access memory (SRAM) chip, or a flash memory chip. Further, a plurality of semiconductor elements 40 including a logic chip and a memory chip may be mounted on the wiring substrate 20.

The connection terminals 41 may each be, for example, a gold bump or a solder bump. The material of the solder bump may be, for example, an alloy containing lead (Pd), an alloy of tin (Sn) and Au, an alloy of Sn and Cu, an alloy of Sn and silver (Ag), or an alloy of Sn, Ag, and Cu.

A space between the wiring substrate 20 and the semiconductor element 40 is filled with the underfill resin 45. The underfill resin 45, for example, fills the recess 24Y and covers the entire surfaces (side surfaces and upper end surfaces 29B) of the bumps 29. The material of the underfill resin 45 may be, for example, an insulative resin such as an epoxy resin.

The external connection terminals 46 are formed on the external connection pads P1 of the wiring substrate 20. As described above, the external connection terminals 46 are used, for example, for electrically connecting to pads formed on a mount substrate such as a motherboard (not illustrated). The external connection terminals 46 may each be, for example, a solder ball or a lead pin. In the present embodiment, the external connection terminals 46 are solder balls.

In the first embodiment, the combination of the insulation layers 21, 24 is an example of an insulation layer. The first surface 21A of the insulation layer 21 is an example of a lower surface of the insulation layer. The second surface 21B of the insulation layer 21 is an example of an intermediate surface of the insulation layer. The second surface 24B of the insulation layer 24 is an example of an upper surface of the insulation layer. Additionally, the insulation layer 21 is an example of a first insulation layer. The insulation layer 24 is an example of a second insulation layer. The wiring layer 22 is an example of a first wiring layer (further wiring layer). The wiring layer 23 is an example of a second wiring layer (outermost wiring layer). The through holes VH1 are an example of a first through hole.

The method for manufacturing the wiring substrate 20 will now be described. Here, a single wiring substrate 20 will be described. However, in the actual process, after a batch of wiring substrates 20 are simultaneously formed on a single substrate, the wiring substrates 20 are singulated. To facilitate understanding, portions that ultimately function as elements of the wiring substrate 20 are indicated by reference characters used to denote the corresponding components of the wiring substrate 20.

Figure 2A:
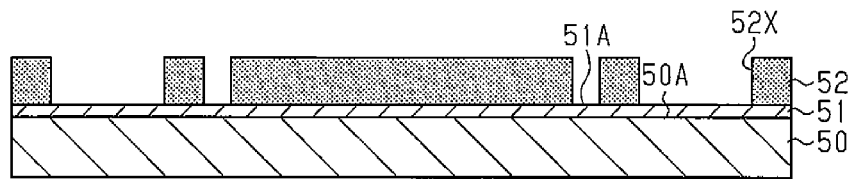
FIGS. 2A to 2D, 3A to 3D, 4A, and 4B are schematic cross-sectional views illustrating steps for manufacturing the wiring substrate illustrated in FIG. 1.

In a step illustrated in FIG. 2A, a support substrate 50 is prepared. The support substrate 50 may be, for example, a metal plate or a metal foil. In the present embodiment, the support substrate 50 is a copper plate. The support substrate 50 may have a thickness of, for example, approximately 50 to 200 μm.

Then, a metal film 51 is formed on a first surface 50A (here, upper surface) of the support substrate 50. The metal film 51 may be formed, for example, through an electrolytic plating process, a sputtering process, or a vapor deposition process. The metal film 51 may be formed from a conductive material so that the metal film 51 can be selectively etched, for example, relative to the wiring layer 23 (e.g., Cu layer), which is formed in a subsequent step. The material of the metal film 51 may be, for example, a metal such as Ni, chromium (Cr), Sn, cobalt (Co), iron (Fe), or Pd or an alloy containing at least one metal selected from these metals. In the present embodiment, the material of the metal film 51 is Ni. The metal film 51 may have a thickness of, for example, approximately 0.1 to 10 μm. In the present embodiment, the first surface 50A of the support substrate 50 and a first surface 51A of the metal film 51 are flat. In the present embodiment, the combination of the support substrate 50 and the metal film 51 functions as a support body.

Then, a resist layer 52 including open patterns 52X is formed on the first surface 51A of the metal film 51. The open patterns 52X expose portions of the metal film 51 corresponding to regions where the wiring layer 23 (refer to FIG. 1) is formed. The resist layer 52 may be formed, for example, from a material that is resistant to plating, which is performed in the next step. The material of the resist layer 52 may be, for example, a photosensitive dry film resist or a liquid photoresist (e.g., dry film resist or liquid resist formed from novolac resin or acrylic resin). For example, when a photosensitive dry film resist is used, a dry film is laminated to the first surface 51A of the metal film 51 through thermo-compression bonding, and the dry film is patterned through a photolithography process. This forms the resist layer 52. When a liquid photoresist is used, the resist layer 52 is formed through the same steps.

Figure 2B:
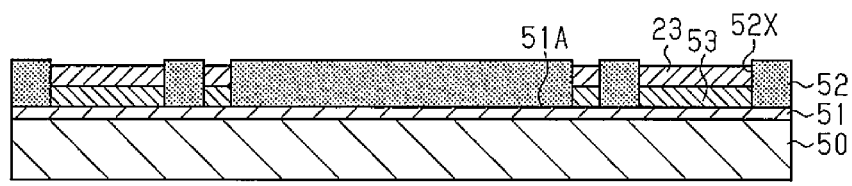

In a step illustrated in FIG. 2B, a metal layer 53 is formed on the first surface 51A of the metal film 51 exposed from the open patterns 52X of the resist layer 52. The metal layer 53 may be formed from a conductive material so that the metal layer 53 can be selectively etched, for example, relative to the wiring layer 23 (e.g., Cu layer), which is formed in a subsequent step. The material of the metal layer 53 may be, for example, a metal such as Ni, Cr, Sn, Co, Fe, or Pd or an alloy containing at least one metal selected from these metals. In the present embodiment, the material of the metal layer 53 is Ni, which is the same as the material of the metal film 51. The metal layer 53 may have a thickness of, for example, approximately 1 to 3 μm.

The first surface 51A of the metal film 51 undergoes electrolyte plating (here, electrolyte Ni plating), for example, using the resist layer 52 as a plating mask and the metal film 51 as a plating power feeding layer. This forms the metal layer 53 on the first surface 51A of the metal film 51 exposed from the open patterns 52X of the resist layer 52.

The wiring layer 23 is formed on the metal layer 53. The metal layer 53 undergoes electrolyte plating (here, electrolyte Cu plating), for example, using the resist layer 52 as a plating mask and the metal film 51 as a plating power feeding layer. This forms the wiring layer 23 (electrolyte plating metal layer) on the metal layer 53 exposed from the open patterns 52X of the resist layer 52. Subsequently, the resist layer 52 is removed, for example, with an alkaline remover.

Figure 2C:
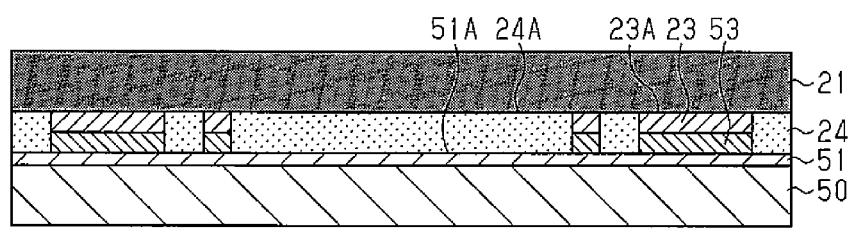

As illustrated in FIG. 2C, the low viscosity insulation layer 24 is formed on the first surface 51A of the metal film 51 to cover the side surfaces of the wiring layer 23 and the side surfaces of the metal layer 53. When a resin film is used as the insulation layer 24, for example, the resin film is laminated to the first surface 51A of the metal film 51. The resin film is pressed and cured at the curing temperature or above (e.g., approximately 130° C. to 200° C.) to form the insulation layer 24. In this case, the lamination of the resin film in a vacuum atmosphere may prevent formation of voids. The resin film may be, for example, a thermosetting resin film including an epoxy resin as the main component. When a liquid or paste-like insulative resin is used as the insulation layer 24, the liquid or paste-like insulative resin is applied to the first surface 51A of the metal film 51 through a spin coating process or the like. The applied insulative resin is heated and cured at the curing temperature or above to form the insulation layer 24. The liquid or paste-like insulative resin may be, for example, a thermosetting resin including an epoxy resin as the main component. This fills spaces formed between adjacent wiring patterns in the wiring layer 23 and spaces formed between adjacent wiring patterns in the metal layer 53 with the insulation layer 24. Since the insulation layer 24 has a low viscosity, the spaces between the wiring patterns in the wiring layer 23 and the spaces between the wiring patterns in the metal layer 53 may be suitably filled with the insulation layer 24.

The insulation layer 21, which has a higher viscosity than the insulation layer 24, is formed on a first surface 24A (here, upper surface) of the insulation layer 24 to cover the first surface 24A of the insulation layer 24 and a first surface 23A of the wiring layer 23. The insulation layer 21 may be formed in the same process as that of the insulation layer 24. The insulation layer 21 has a higher viscosity than the insulation layer 24. Thus, the insulation layer 21 may have a desired thickness even when undergoing a pressing process. This obtains high dielectric strength between the wiring layer 22 (formed in a subsequent step) and the wiring layer 23 compared to when only the low viscosity insulation layer 24 is located between the wiring layer 22 and the wiring layer 23.

Figure 2D:
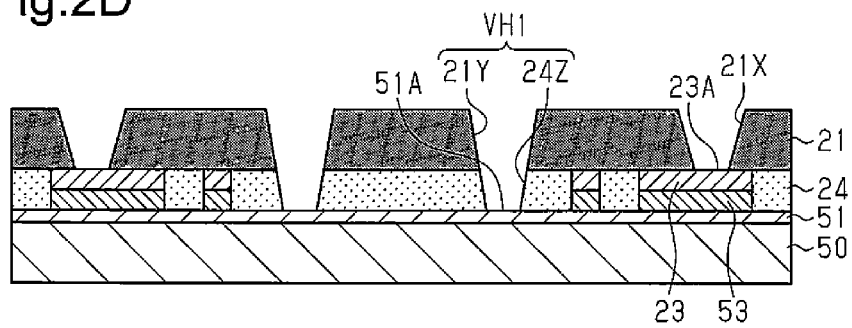

In a step illustrated in FIG. 2D, the through holes 21X are formed in predetermined portions of the insulation layer 21 to partially expose the first surface 23A of the wiring layer 23. Additionally, the through holes VH1 are formed in predetermined portions of the insulation layers 21, 24 to partially expose the first surface 51A of the metal film 51. The through holes VH1 each include a through hole 21Y, which extends through the insulation layer 21 in the thickness-wise direction, and a through hole 24Z, which is in communication with the through hole 21Y and extends through the insulation layer 24 in the thickness-wise direction. The through holes 21X and the through holes VH1 (21Y, 24Z) may be formed through a laser cutting process using, for example, a $CO_2$ laser or a YAG laser. When the insulation layers 21, 24 are formed from a photosensitive resin, the through holes 21X, 21Y, 24Z may be formed through a photolithography process.

When the through holes 21X, VH1 are formed through a laser cutting process, a desmear process is performed to remove resin residue (resin smear) of the insulation layer 21 from the first surface 23A of the wiring layer 23 exposed in the through holes 21X and remove resin smear of the insulation layers 21, 24 from the first surface 51A of the metal film 51 exposed in the through holes VH1. The desmear process may be performed using, for example, permanganate.

Figure 3A:
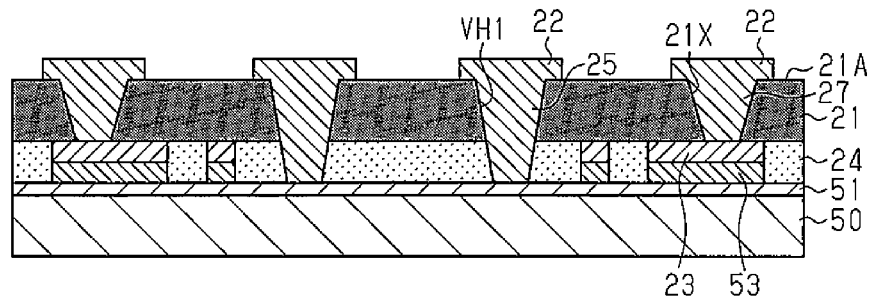

In a step illustrated in FIG. 3A, the through holes 21X are filled with a via conductor to form the via wirings 27. At the same time, the through holes VH1 are filled with the via conductor to form the connection terminals 25. Additionally, the wiring layer 22 is formed on the first surface 21A of the insulation layer 21. The wiring layer 22 is formed integrally with each of the via wirings 27 and the connection terminals 25. Thus, the wiring layer 22 is electrically connected to the wiring layer 23 by the via wirings 27 and also electrically connected to the connection terminals 25. Consequently, the entire side surfaces of the connection terminals 25 are covered by the insulation layers 21, 24. The via wirings 27, the connection terminals 25, and the wiring layer 22 may be formed through a wiring formation process such as a semi-additive process or a subtractive process.

Figure 3B:
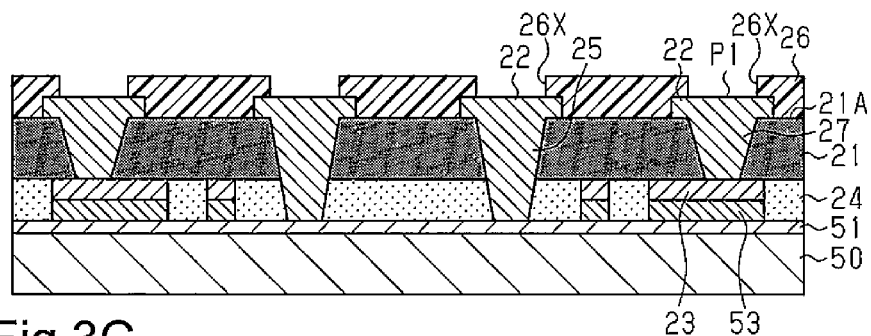

In a step illustrated in FIG. 3B, the solder resist layer 26 is formed on the first surface 21A of the insulation layer 21. The solder resist layer 26 includes the openings 26X, which expose predetermined portions of the wiring layer 22 as the external connection pads P1. The solder resist layer 26 is formed, for example, by laminating with a photosensitive solder resist film or applying a liquid solder resist and then patterning the resist in a predetermined shape through a photolithography process. Alternatively, the openings 26X may be formed, for example, through a laser cutting process using, for example, a $CO_2$ laser or a YAG laser. If necessary, a surface-processed layer may be formed on the external connection pads P1.

Figure 3C:
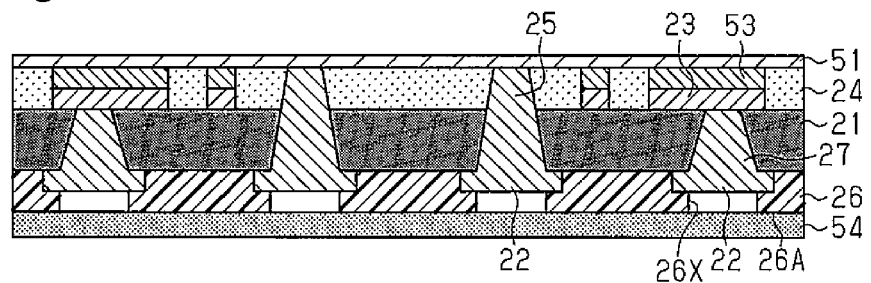

In a step illustrated in FIG. 3C, the support substrate 50 (refer to FIG. 3B), which serves as a temporary substrate, is removed. For example, when a copper plate is used as the support substrate 50, the support substrate 50 may be selectively removed from the metal film 51 (Ni layer) through wet etching using a solution of ferric chloride, a solution of copper chloride, a solution of ammonium persulfate, or the like. In this case, the metal film 51 (Ni layer) functions as an etching stopper layer when etching the support substrate 50. However, when the outermost surface of the wiring layer 22 is formed from Cu, the wiring layer 22 needs to be masked to prevent the wiring layer 22 from being etched when etching the support substrate 50. FIG. 3C is a view illustrating the structural body illustrated in FIG. 3B that is turned upside down.

In a step illustrated in FIG. 3C, a masking material 54 is formed to cover a first surface 26A (here, lower surface) of the solder resist layer 26. The masking material 54 hinders a plating solution from entering the openings 26X and contacting the wiring layer 22 during a plating process performed in the next step. Thus, the masking material 54 includes a material resistant to plating. The masking material 54 may be, for example, a masking tape or a resist layer. The material of the masking tape may be, for example, a vinyl chloride film or a polyethylene terephthalate (PET) film. For example, when a masking tape is used as the masking material 54, the masking tape is attached to the solder resist layer 26. In this case, the masking material 54 (masking tape) temporarily adheres to the solder resist layer 26 so that the masking material 54 can be easily removed from the solder resist layer 26 in a subsequent step.

Figure 3D:
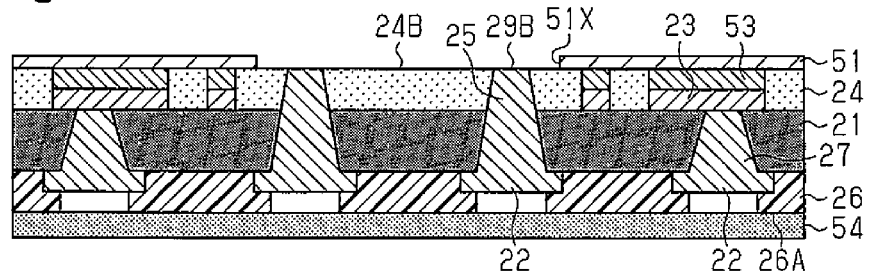

In a step illustrated in FIG. 3D, an opening 51X is formed in a portion of the metal film 51 that corresponds to a region where the recess 24Y (refer to FIG. 1) is formed. The opening 51X partially exposes the second surface 24B of the insulation layer 24, which was in contact with the metal film 51. The opening 51X may be formed, for example, through a subtractive process. The opening 51X also exposes the upper end surfaces 29B of the connection terminals 25.

When forming a resist layer (not illustrated) that is used to form the opening 51X, the masking material 54, which is formed from a dry film resist or the like, may be formed on the first surface 26A of the solder resist layer 26.

Figure 4A:
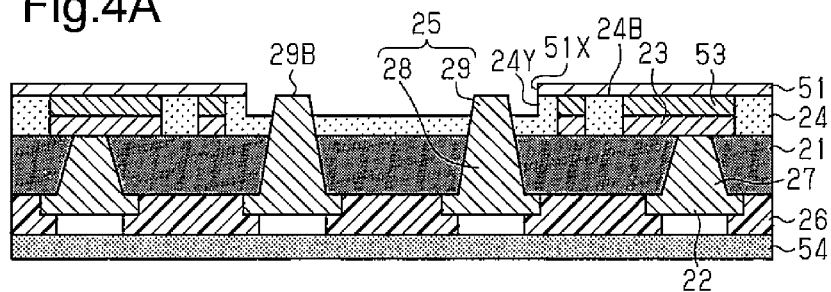

In a step illustrated in FIG. 4A, the metal film 51 including the opening 51X functions as a conformal mask to thin the portion of the insulation layer 24 that is exposed through the opening 51X. This forms the recess 24Y in the insulation layer 24. The recess 24Y may be formed, or the insulation layer 24 may be thinned, for example, through a blasting process such as a sandblasting process or a plasma processing. For example, when the recess 24Y is formed through a sandblasting process, abrasive grains are blasted against the second surface 24B (exposed portion) of the insulation layer 24 in the opening 51X to thin the insulation layer 24 to a predetermined thickness. In this case, the insulation layer 24 is removed until a surface of the thinned insulation layer 24, or a bottom surface of the recess 24Y, becomes lower than the upper end surfaces 29B of the connection terminals 25. Consequently, one end (here, upper end) of each connection terminal 25, which is located in the recess 24Y, is exposed to the exterior. The exposed end of the connection terminal 25 defines the bump 29.

In the sandblasting process, the cutting rate of the connection terminals 25, which are formed from a material such as metal having a relatively small brittleness, is lower than the cutting rate of the insulation layer 24, which is formed from a material such as cured resin having a relatively large brittleness. Thus, the connection terminals 25 are more resistant to cutting than the insulation layer 24. The shape of the connection terminals 25 is slightly changed through a blasting process. However, the exposed ends, or the bumps 29, of the connection terminals 25 exposed from the insulation layer 24 through the thinning process are damaged by the blowing abrasive grains. Thus, the bumps 29 have a greater surface roughness than the via wirings 28, which are covered by the insulation layer 24.

The metal film 51 and the metal layer 53 are removed. The metal film 51 and the metal layer 53 (here, Ni layers) are selectively etched relative to the wiring layer 23, the connection terminals 25, and the insulation layer 24. In this case, the wiring layer 23, the connection terminals 25 (Cu layer), and the insulation layer 24 function as etching stopper layers when etching the metal film 51 and the metal layer 53. In this case, an etchant may be, for example, a mixed solution ($HNO_3/H_2O_2$) of nitric acid and hydrogen peroxide. Consequently, as illustrated in FIG. 4B, the second surface 23B of the wiring layer 23 and the second surface 24B of the insulation layer 24 are exposed to the exterior.

If necessary, a surface-processed layer may be formed on the surfaces of the bumps 29 and the second surface 23B of the wiring layer 23, which are exposed from the insulation layer 24.

Figure 4B:
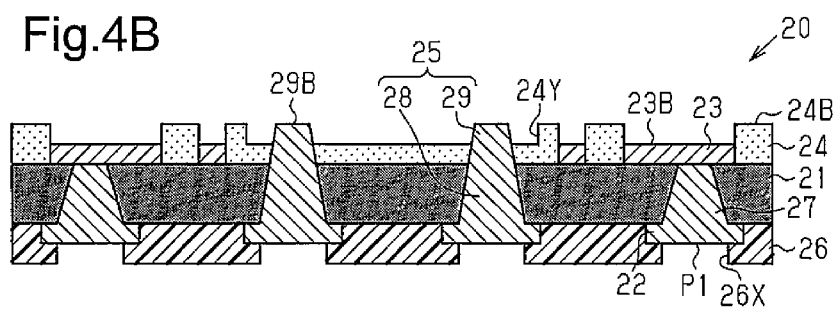

Additionally, in the step illustrated in FIG. 4B, the masking material 54, which is illustrated in FIG. 4A, is removed. For example, when the masking tape is used as the masking material 54, the masking material 54 is mechanically removed from the solder resist layer 26. Through the manufacturing steps, the wiring substrate 20 may be manufactured.

A method for manufacturing the semiconductor device 10 will now be described.

Figure 4C:
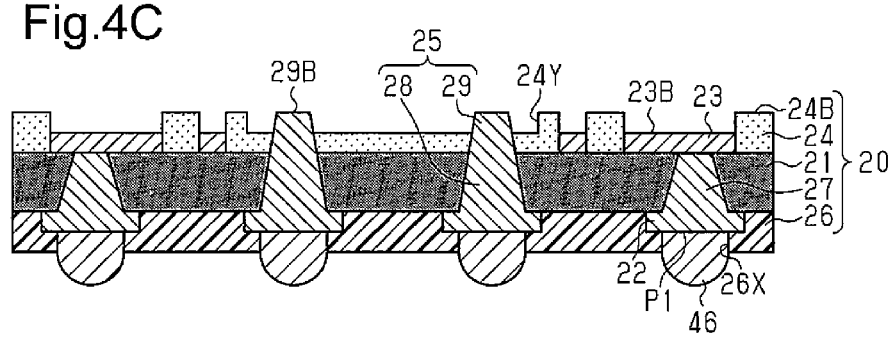
FIGS. 4C and 4D are schematic cross-sectional views illustrating steps for manufacturing the semiconductor device illustrated in FIG. 1.

In a step illustrated in FIG. 4C, the external connection terminals 46 are formed on the external connection pads P1. For example, after flux is appropriately applied to the external connection pads P1, the external connection terminals 46 (here, solder balls) are mounted on the pads P1. The external connection terminals 46 are fixed to the pads P1 through reflow soldering at a temperature of approximately 240° C. to 260° C. Subsequently, the flux is removed through a surface cleaning process.

Figure 4D:
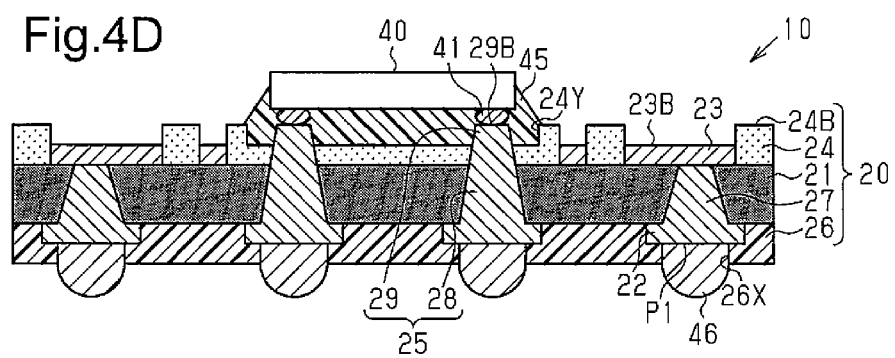

In a step illustrated in FIG. 4D, the semiconductor element 40 is mounted on the wiring substrate 20. In the present embodiment, the connection terminals 41 of the semiconductor element 40 are flip-chip-bonded to the bumps 29 of the wiring substrate 20. Then, a space formed between the semiconductor element 40 and the wiring substrate 20 is filled with the underfill resin 45, and the underfill resin 45 is cured. Through the manufacturing steps, the semiconductor device 10 illustrated in FIG. 1 may be manufactured.

The first embodiment has the advantages described below.

(1) The bumps 29 are formed in the recess 24Y of the insulation layer 24. Thus, the bumps 29 are surrounded and guarded by the insulation layer 24, which includes the side walls defining the recess 24Y. This hinders the bumps 29 from receiving external force such as contact force compared to a conventional art such as that illustrated in FIG. 18C. This limits deformation of the bumps 29 caused by external force and improves the connection reliability between the bumps 29 and the connection terminals 41 of the semiconductor element 40.

(2) The second surface 23B (in FIG. 1, upper surface) of the wiring layer 23, which is formed on the second surface 21B (in FIG. 1, upper surface) of the insulation layer 21, is located below the upper end surfaces 29B of the bumps 29. This increases the degree of freedom for designing the wiring substrate 20 and extends an applicable range of the wiring substrate 20. For example, when a portion of the wiring layer 23 (outermost wiring layer) includes connection pads used for electrically connecting to another semiconductor device or another wiring substrate, the wiring substrate 20 may be connected to a further semiconductor device or the like.

Figure 18A:
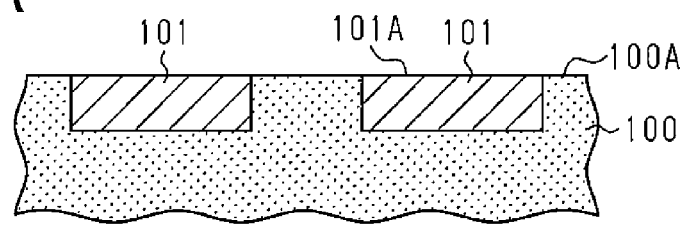
FIGS. 18A to 18C are schematic cross-sectional views illustrating steps for manufacturing a conventional wiring substrate.
Figure 18B:
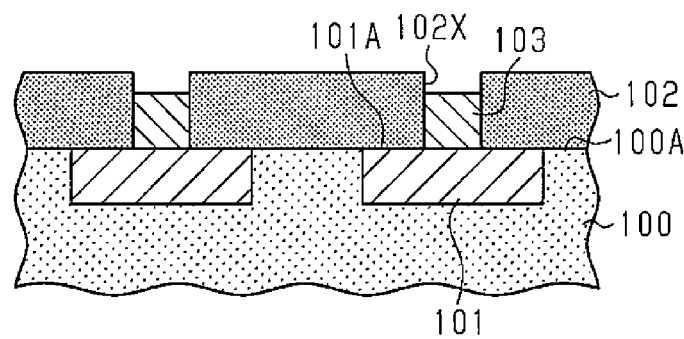
Figure 18C:
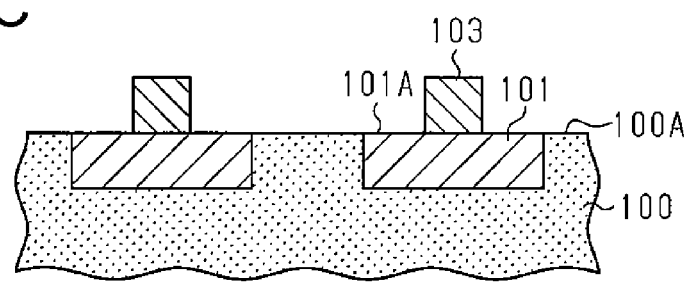

(3) In the conventional wiring substrate illustrated in FIG. 18C, a connection interface is located between each pad 101 and the corresponding bump 103. Thus, when physical stress such as an impact is applied to the bump 103, breakage or the like tends to occur in the connection interface between the bump 103 and the pad 101. When a semiconductor element is connected to the bumps 103, the bumps 103 receive thermal stress due to the difference in thermal expansion coefficient between the semiconductor element and the insulation layer 100 in accordance with temperature change caused by thermal processing or the like. Such thermal stress may cause breakage, cracks, or the like in the connection interfaces between the bumps 103 and the pads 101. More specifically, the structure for connecting the pads 101 and the bumps 103 in the conventional wiring substrate has low connection reliability against physical stress and thermal stress. Particularly, when the bumps 103 become finer in accordance with miniaturization of the semiconductor device, an area where the bumps 103 and the pad 101 contact is decreased. This increases the significance of the problem described above.

In this regard, in the wiring substrate 20, the bumps 29 are formed integrally with the via wirings 28, and the connection terminals 25 including the bumps 29 and the via wirings 28 are formed integrally with the wiring layer 22. Thus, the connection interface, which is included in the conventional art (i.e., connection interface located between pad 101 and bump 103), is not located between the bumps 29 and the via wirings 28 nor between the via wirings 28 (connection terminal 25) and the wiring layer 22. This prevents breakage and cracks that would occur due to the interface. More specifically, breakage and cracks caused by physical stress or thermal stress may be inhibited from occurring between the bumps 29 and the via wirings 28 and between the connection terminals 25 and the wiring layer 22. This improves the connection reliability of the wiring substrate 20 against physical stress and thermal stress from the conventional art and allows for easy application to finer bumps 29.

(4) The bumps 29 are each tapered from the side proximate to the first surface 21A of the insulation layer 21 toward the second surface 24B of the insulation layer 24. The inclined side surfaces of the bumps 29 reduce stress concentrating on the bumps 29 compared to the conventional bumps 103, which are not tapered. Additionally, in each connection terminal 25, the circumferential surface (side surface) of the via wiring 28 and the circumferential surface (side surface) of the bump 29 are continuous and linear in a cross-sectional view. This further reduces the stress concentrating on the bumps 29. Thus, breakage and cracks may be inhibited from occurring in the bumps 29.

(5) The through holes VH1 are formed to expose the first surface 51A of the metal film 51, which is formed on the support substrate 50. The through holes VH1 are filled with the via conductor to form the connection terminals 25. Then, a portion of the second surface 24B of the insulation layer 24 that is in contact with the first surface 51A of the metal film 51 is thinned. This exposes an end of each connection terminal 25 to the exterior and forms the bumps 29. Consequently, the upper end surfaces 29B of the bumps 29 and the second surface 24B of the insulation layer 24 are located on substantially the same plane. This accurately controls the height of the upper end surfaces 29B of the bumps 29, that is, the height-wise dimension of the bumps 29 (projection amount of the bumps 29), and improves the reliability for mounting the semiconductor element 40.

In the conventional art, after the support substrate is removed, the bumps 103 are formed on the upper surfaces 101A of the pads 101, which were in contact with the support contact. More specifically, although the pads 101 are formed when the wiring substrate is supported by the support substrate, the bumps 103 are formed after the support substrate is removed. Thus, the planar position of the pads 101 relative to the bumps 103 is affected by thermal contraction or the like caused by the removal of the support substrate.

In this regard, in the first embodiment, when the structural body (refer to FIGS. 2D and 3A) corresponding to the wiring substrate 20 is supported by the support substrate 50 and the metal film 51, the through holes VH1, the connection terminals 25, and the wiring layer 22 are formed. Thus, the planar position of the connection terminals 25 relative to the wiring layer 22 is not affected by thermal contraction or the like that would be caused by the removal of the support substrate 50 and the metal film 51. This accurately controls the planar position of the connection terminals 25 relative to the wiring layer 22.

Second Embodiment

A second embodiment will now be described with reference to FIGS. 5A to 6C. The second embodiment differs from the first embodiment in the method for manufacturing the wiring substrate 20. Here, the description will focus on the differences from the first embodiment. The same reference characters are given to those components that are the same as the corresponding components illustrated in FIGS. 1 to 4D. Such components will not be described in detail.

Figure 5A:
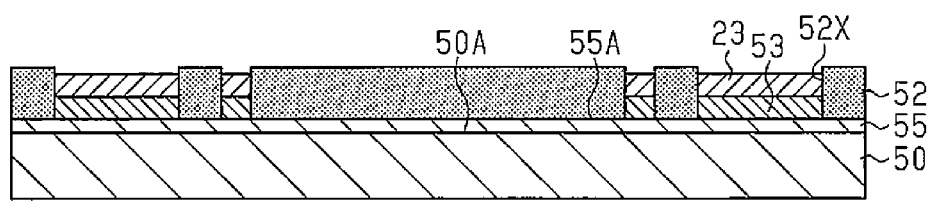
FIGS. 5A to 5C and 6A to 6C are schematic cross-sectional views illustrating steps for manufacturing a second embodiment of a wiring substrate (FIG. 6B is a partially enlarged cross-sectional view of FIG. 6A)

In a step illustrated in FIG. 5A, a metal film 55 is formed on the first surface 50A of the support substrate 50. The metal film 55 may be formed, for example, through an electrolyte plating process, a sputtering process, or a vapor deposition process. The metal film 55 may be formed, for example, from the same conductive material (here, Cu) as that forming the support substrate 50. In the second embodiment, the combination of the support substrate 50 and the metal film 55 functions as a support body.

In the same manner as in the steps illustrated in FIGS. 2A and 2B, the resist layer 52 including the open patterns 52X is formed on a first surface 55A (here, upper surface) of the metal film 55. The metal layer 53 and the wiring layer 23 are sequentially stacked on the first surface 55A of the metal film 55 exposed in the open patterns 52X.

Figure 5B:
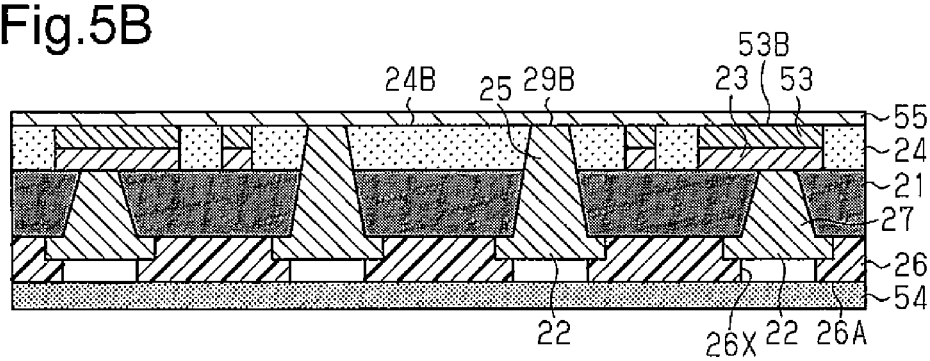

The same steps as those illustrated in FIGS. 2C to 3C are performed to obtain the structural body illustrated in FIG. 5B. The structural body illustrated in FIG. 5B is substantially the same as that illustrated in FIG. 3C. However, the metal film 51 illustrated in FIG. 3C is changed to the metal film 55. As illustrated in FIG. 5B, the metal film 55 covers the second surface 53B (here, upper surface) of the metal layer 53, the second surface 24B of the insulation layer 24, and the upper end surfaces 29B of the connection terminals 25.

Figure 5C:
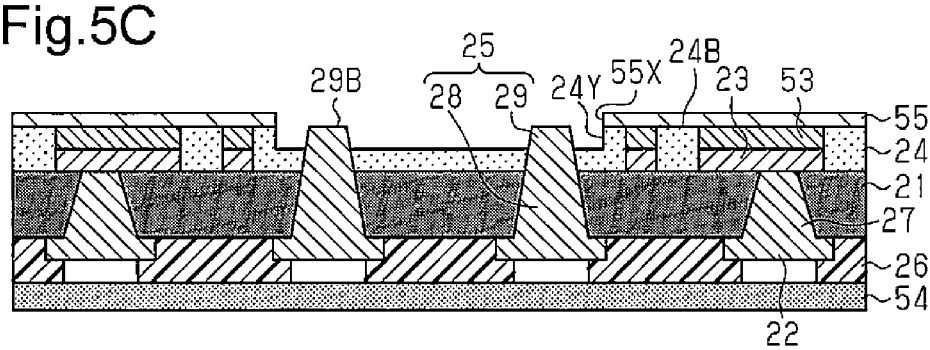

In a step illustrated in FIG. 5C, which is performed in the same manner as the step illustrated in FIG. 3D, an opening 55X is formed in a portion of the metal film 55 that corresponds to the region where the recess 24Y (refer to FIG. 1) is formed. In the same manner as in the step illustrated in FIG. 4A, a portion of the insulation layer 24 exposed through the opening 55X is thinned to form the recess 24Y. Consequently, the bumps 29 of the connection terminals 25 are projected upward from the surface of the thinned insulation layer 24 and exposed to the exterior. To ensure the formation of the opening 55X extending through the metal film 55, when forming the opening 55X, it is preferable to perform etching until the upper end surfaces 29B of the bumps 29 are partially shaved. Thus, although not illustrated in the drawings, the upper end surfaces 29B of the bumps 29 are located slightly below the second surface 24B of the insulation layer 24.

Figure 6A:
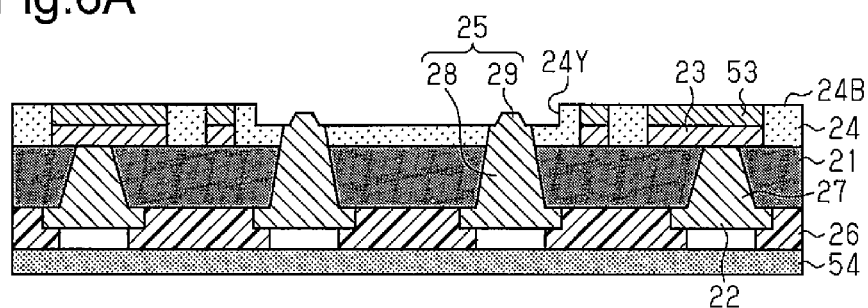
Figure 6B:
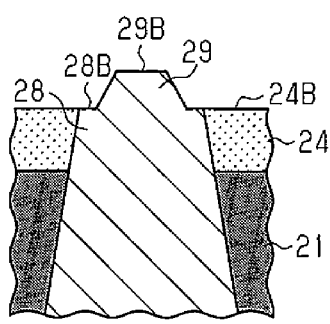

The metal film 55 is removed. For example, when the material of the metal film 55 is Cu, the metal film 55 is selectively removed relative to the metal layer 53 (Ni layer) and the insulation layer 24 through wet etching using a solution of ferric chloride, a solution of copper chloride, a solution of ammonium persulfate, or the like. In this case, the bumps 29 of the connection terminals 25 are formed from Cu, which is the same material as that forming the metal film 55, and exposed from the insulation layer 24. Thus, the bumps 29 are also etched. Consequently, as illustrated in FIG. 6A, the entire bumps 29 are reduced in size compared to the via wirings 28. As illustrated in FIG. 6B, when the metal film 55 is removed through an isotropic etching process, the bumps 29 are evenly etched in all directions. Thus, the upper end surface 29B and the side surface of each bump 29 are etched toward an inner side of the connection terminal 25. For example, when the via wiring 28 is shaped as a truncated cone, the bump 29 formed on the via wiring 28 has the form of a truncated cone that is slightly smaller than the via wiring 28. Thus, the side surface of the via wiring 28 and the side surface of the bump 29 are stepped. The upper surface 28B of the via wiring 28 is partially exposed around the bump 29. Even in this case, the bump 29 is tapered from the lower side toward the upper side in FIG. 6B. Additionally, the bump 29, the via wiring 28, and the wiring layer 22 are formed integrally with each other. The miniaturized bumps 29 are located in the recess 24Y and exposed to the exterior.

Figure 6C:
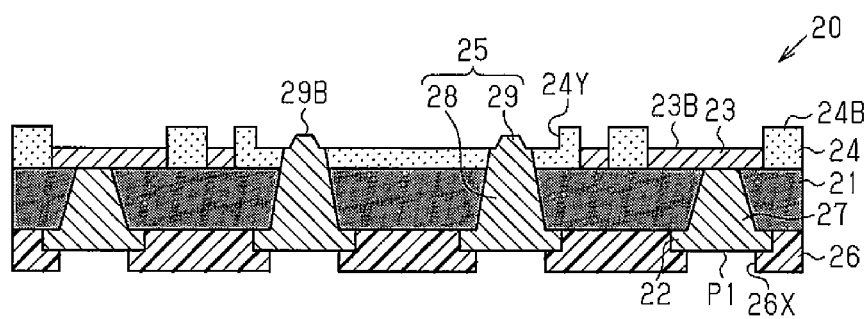

In a step illustrated in FIG. 6C, which is performed in the same manner as the step illustrated in FIG. 4B, the metal layer 53 and the masking material 54, which are illustrated in FIG. 6A, are removed. Through the manufacturing steps, the wiring substrate 20 of the second embodiment may be manufactured.

The second embodiment has the same advantages as the first embodiment.

Third Embodiment

A third embodiment will now be described with reference to FIGS. 7 to 9C. Here, the description will focus on the differences from the first embodiment. The same reference characters are given to those components that are the same as the corresponding components illustrated in FIGS. 1 to 6C. Such components will not be described in detail.

Figure 7:
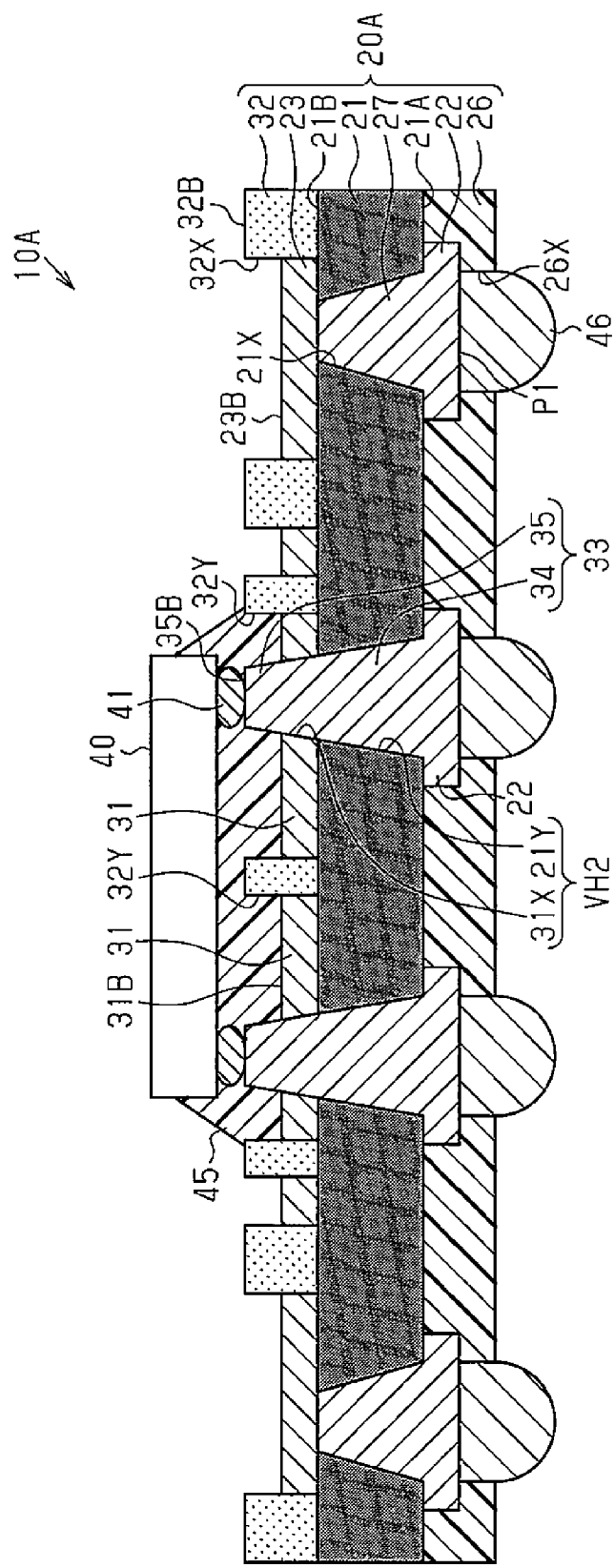
FIG. 7 is a schematic cross-sectional view illustrating a semiconductor device including a third embodiment of a wiring substrate.

As illustrated in FIG. 7, a semiconductor device 10A includes a wiring substrate 20A, one or more semiconductor elements 40 (FIG. 7 illustrates only one) mounted on the wiring substrate 20A, the underfill resin 45, and the external connection terminals 46.

The wiring substrate 20A includes the insulation layer 21, the wiring layers 22, 23, the via wirings 27, a wiring layer 31, an insulation layer 32, connection terminals 33, and the solder resist layer 26.

The wiring layer 23 is formed on the second surface 21B of the insulation layer 21. The wiring layer 23 functions as the outermost wiring layer (here, uppermost wiring layer). The wiring layer 31 is formed on the second surface 21B of the insulation layer 21. The wiring layer 31 is located in the region where, for example, the semiconductor element 40 is mounted. The wiring layer 31 and the wiring layer 23 are located on the same plane. That is, the wiring layers 23, 31 are arranged in the same layer. Additionally, the wiring layer 31 and the wiring layer 23 have substantially the same thickness. The material of the wiring layer 31 may be, for example, copper or an alloy of copper.

The insulation layer 32 is formed on the second surface 21B of the insulation layer 21. The insulation layer 32 is in contact with side surfaces of the wiring layers 23, 31 and covers the entire side surfaces of the wiring layers 23, 31. The insulation layer 32 may be formed, for example, from the same material as that forming the insulation layer 24. The insulation layer 32 covers the entire portions of the second surface 21B of the insulation layer 21 that are exposed from the wiring layers 23, 31. In other words, the insulation layer 32 includes openings 32X, which entirely expose the second surface 23B of the wiring layer 23, and openings 32Y, which entirely expose a second surface 31B (here, upper surface) of the wiring layer 31. Thus, the wiring layer 23 is formed on bottom surfaces of recesses formed by the openings 32X of the insulation layers 32 and the second surface 21B of the insulation layer 21. The wiring layer 31 is formed on bottom surfaces of recesses formed by the openings 32Y of the insulation layer 32 and the second surface 21B of the insulation layer 21.

The insulation layer 32 is thicker than each of the wiring layers 23, 31. Thus, the second surface 23B of the wiring layer 23 and the second surface 31B of the wiring layer 31 are located below a second surface 32B of the insulation layer 32.

The through holes 31X extends through predetermined portions of the wiring layer 31 in the thickness-wise direction. The through holes 31X are in communication with the corresponding through holes 21Y of the insulation layer 21. In the present embodiment, a wall surface defining each through hole 21Y is continuous with a wall surface defining the corresponding through hole 31X. The in-communication through holes 21Y, 31X each define a through hole VH2, which extends through the insulation layer 21 and the wiring layer 31 in the thickness-wise direction. The openings 32Y (recesses), which are formed in the mount region, overlap the through holes VH2 (through holes 21Y, 31X) in a plan view. The through holes VH2 are each tapered so that the diameter is decreased from the lower side (side proximate to first surface 21A of insulation layer 21) toward the upper side (side proximate to second surface 32B of insulation layer 32) in FIG. 7. The through holes VH2 may each be shaped as, for example, a truncated cone.

The connection terminals 33, which are formed integrally with the wiring layer 22, are located in the through holes VH2. The connection terminals 33 each include a via wiring 34 and a bump 35. The through hole VH2 is filled with the via wiring 34, which is formed integrally with the wiring layer 22. The bump 35, which is formed integrally with the via wiring 34, is located in the opening 32Y and exposed to the exterior.

In the same manner as the through holes VH2, the via wirings 34 are each tapered so that the diameter is decreased from the lower side toward the upper side in FIG. 7. The side surface of each via wiring 34 is partially in contact with the wiring layer 31, which includes an inner wall defining the through hole 31X, and electrically connected to the wiring layer 31. Thus, the via wiring 34 electrically connects the wiring layers 22, 31.

The bumps 35 respectively project from the through holes VH2 in the openings 32Y. Additionally, each bump 35 projects upward from the second surface 31B of the wiring layer 31, which is formed in the opening 32Y. More specifically, each bump 35 projects in a recess that is formed by a wall surface defining the opening 32Y and the second surface 31B of the wiring layer 31. In the same manner as the via wirings 34, the bumps 35 are each tapered from the lower side toward the upper side (side proximate to second surface 32B of insulation layer 32) in FIG. 7. In the present embodiment, each via wiring 34 and the corresponding bump 35 are tapered so that the diameter is continuously decreased from the lower side toward the upper side in FIG. 7. Additionally, in each connection terminal 33, the circumferential surface (side surface) of the via wiring 34 and the circumferential surface (side surface) of the bump 35 are continuous and linear in a cross-sectional view.

The side surfaces of the bumps 35 are not in contact with the insulation layer 32 and the wiring layer 31 and not directly covered by the insulation layer 32 and the wiring layer 31. This exposes the side surface and an upper end surface 35B of each bump 35 to the exterior. However, the bumps 29 are arranged in the openings 32Y (recesses). Thus, the insulation layer 32, which includes side walls defining the openings 32Y and covers the entire side surfaces of the wiring layer 31, is located at a position separated from the bumps 35 in the planar direction.

The upper end surface 35B of each bump 35 is, for example, circular in a plan view. The upper end surface 35B is flat. Thus, the upper end surface 35B (flat surface) serves as a distal portion of the bump 35. The upper end surfaces 35B of the bumps 35 and the second surface 32B of the insulation layer 32 are located on substantially the same plane. Thus, the upper end surfaces 35B of the bumps 35 are located above the second surface 23B of the wiring layer 23 and the second surface 31B of the wiring layer 31.

If necessary, a surface-processed layer may be formed on a surface (upper end surface 35B and side surface or only upper end surface 35B) of each connection terminal 33 (i.e., bump 35) exposed from the insulation layer 32. In the same manner, a surface-processed layer may be formed on the second surfaces 23B, 31B of the wiring layers 23, 31.

The semiconductor element 40 is flip-chip-mounted on the wiring substrate 20A. In the present embodiment, when the connection terminals 41 of the semiconductor element 40 are bonded to the bumps 35 of the wiring substrate 20A, the semiconductor element 40 is electrically connected to the wiring layer 22 by the connection terminals 41 and the connection terminals 33.

In the third embodiment, the combination of the insulation layers 21, 32 is an example of an insulation layer. The first surface 21A of the insulation layer 21 is an example of a lower surface of the insulation layer. The second surface 21B of the insulation layer 21 is an example of an intermediate surface of the insulation layer. The second surface 32B of the insulation layer 32 is an example of an upper surface of the insulation layer. Additionally, the insulation layer 21 is an example of a first insulation layer. The insulation layer 32 is an example of a second insulation layer. The wiring layer 22 is an example of a first wiring layer (further wiring layer). The wiring layer 23 is an example of a second wiring layer (first outermost wiring layer). The wiring layer 31 is an example of a third wiring layer (second outermost wiring layer). The through holes 21Y are an example of a first through hole. The through holes 31X are an example of a second through hole. The openings 32Y are an example of a recess.

The method for manufacturing the wiring substrate 20A will now be described. Here, a single wiring substrate 20A will be described. However, in the actual process, after a batch of wiring substrates 20A are simultaneously formed on a single substrate, the wiring substrates 20A are singulated. To facilitate understanding, portions that ultimately function as elements of the wiring substrate 20A are indicated by reference characters used to denote the corresponding components of the wiring substrate 20A.

Figure 8A:
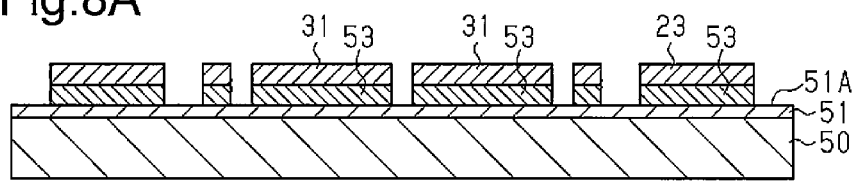
FIGS. 8A to 8D and 9A to 9C are schematic cross-sectional views illustrating steps for manufacturing the wiring substrate illustrated in FIG. 7.

In a step illustrated in FIG. 8A, which is performed in the same manner as the steps illustrated in FIGS. 2A and 2B, the metal film 51, which is formed from Ni, is formed on the support substrate 50. The metal layer 53, which is formed from Ni, and the wiring layer 23, which is formed from Cu, are sequentially stacked on the first surface 51A (here, upper surface) of the metal film 51.

Figure 8B:
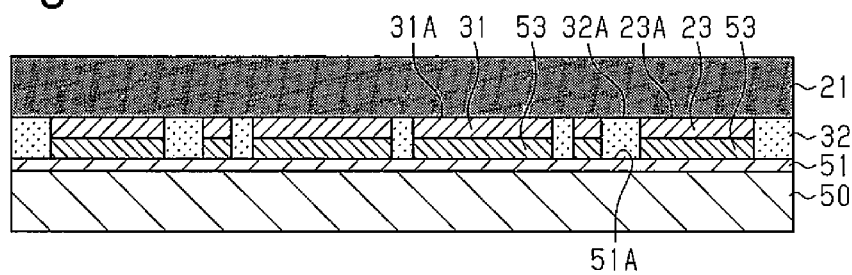

In a step illustrated in FIG. 8B, which is performed in the same manner as the step illustrated in FIG. 2C, the low viscosity insulation layer 32 is formed to cover the side surfaces of the wiring layers 23, 31 and the metal layer 53. Then, the insulation layer 21, which has a higher viscosity than the insulation layer 32, is formed on a first surface 32A (here, upper surface) of the insulation layer 32 to cover the first surface 32A of the insulation layer 32 and the first surfaces 23A, 31A (here, upper surface) of the wiring layers 23, 31.

Figure 8C:
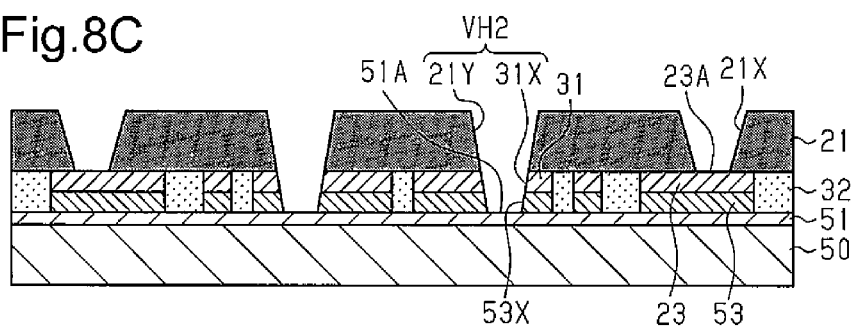

In a step illustrated in FIG. 8C, the through holes 21X are formed in the predetermined portions of the insulation layer 21 to partially expose the first surface 23A of the wiring layer 23. Additionally, the through holes VH2 are formed in the predetermined portions of the insulation layer 21 and the wiring layer 31, and through holes 53X (third through holes) are formed in the predetermined portions of the metal layer 53 to partially expose the first surface 51A of the metal film 51. The through holes VH2 each include a through hole 21Y, which extends through the insulation layer 21 in the thickness-wise direction, and a though hole 31X, which is in communication with the through hole 21Y and extends through the wiring layer 31. Each through hole 53X is in communication with the corresponding through hole 31X (through hole VH2) and extends through the metal layer 53 in the thickness-wise direction. This exposes the first surface 51A of the metal film 51 through the through holes VH2, 53X. The through holes 21X, 21Y, 31X, 53X may be formed through a laser cutting process using, for example, a $CO_2$ laser or a YAG laser. When forming the through holes 53X, the first surface 51A of the metal film 51 may be partially thinned.

Then, a desmear process is performed to remove resin smear of the insulation layer 21 from the first surface 23A of the wiring layer 23 exposed in the through holes 21X and remove resin smear of the insulation layers 21, 32 from the first surface 51A of the metal film 51 exposed in the through holes VH2, 53X.

Figure 8D:
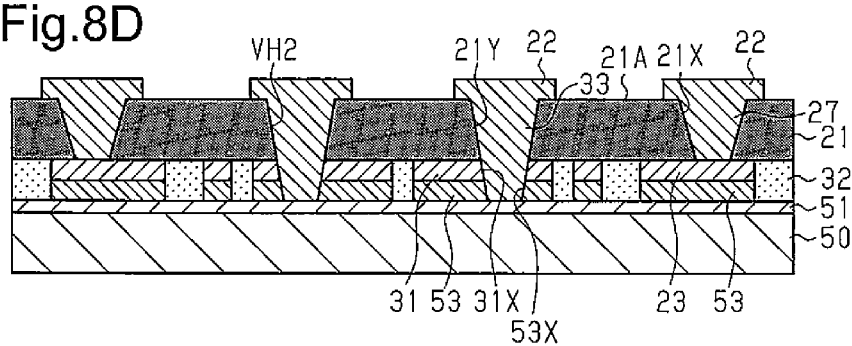

In a step illustrated in FIG. 8D, the through holes 21X are filled with the via conductor to form the via wirings 27. At the same time, the through holes 21Y, 31X, 53X are filled with the via conductor to form the connection terminals 33. Additionally, the wiring layer 22 is formed on the first surface 21A of the insulation layer 21. The wiring layer 22 is formed integrally with each of the via wirings 27 and the connection terminals 33. Thus, the wiring layer 22 is electrically connected to the wiring layer 23 by the via wirings 27 and also electrically connected to the connection terminals 33. Consequently, the entire side surfaces of the connection terminals 33 are covered by the insulation layer 21, the wiring layer 31, and the metal layer 53. The via wirings 27, the connection terminals 33, and the wiring layer 22 may be formed through a wiring formation process such as a semi-additive process or a subtractive process.

Figure 9A:
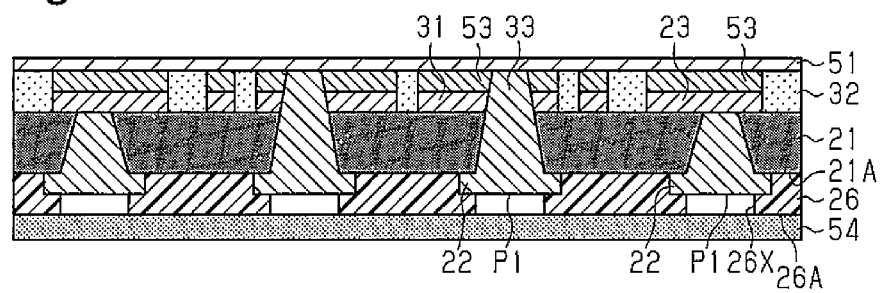

In a step illustrated in FIG. 9A, which is performed in the same manner as the step illustrated in FIG. 3B, after the solder resist layer 26 is formed on the first surface 21A of the insulation layer 21, the support substrate 50 (refer to FIG. 8D) is removed. Then, in the same manner as in the step illustrated in FIG. 3C, the masking material 54 is formed to cover the first surface 26A of the solder resist layer 26.

Figure 9B:
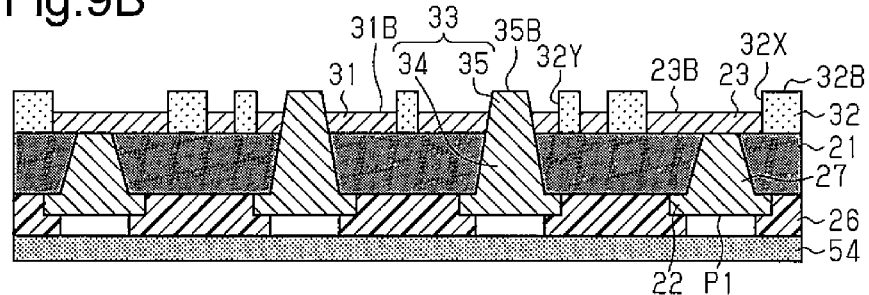

In the same manner as in the step illustrated in FIG. 4B, the metal film 51 and the metal layer 53 are removed. Consequently, as illustrated in FIG. 9B, the second surface 23B of the wiring layer 23 and the second surface 31B of the wiring layer 31 are exposed to the exterior. Additionally, recesses are formed by the wall surfaces defining the openings 32Y in the insulation layer 32 and the second surface 31B of the wiring layer 31. Each connection terminal 33 includes an end (here, upper end) that is located in one of the recesses and exposed to the exterior. The exposed end of the connection terminal 33 defines the bump 35.

Figure 9C:
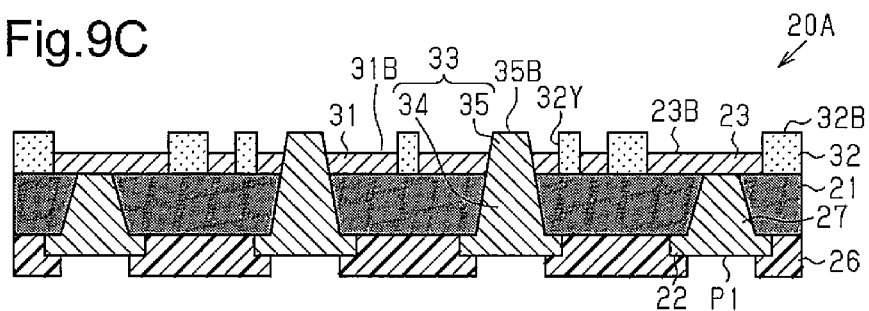

The masking material 54 is removed. Consequently, as illustrated in FIG. 9C, the wiring substrate 20A of the third embodiment may be manufactured.

The third embodiment has the advantage described below in addition to advantages (1) to (5) of the first embodiment.

(6) The wiring layer 31 is formed on the second surface 21B of the insulation layer 21. The through holes 31X, which extend through the wiring layer 31 in the thickness-wise direction, are filled with the connection terminals 33. More specifically, the wiring layer 31, which is electrically connected to the connection terminals 33, is formed on the second surface 21B of the insulation layer 21. For example, a pad may be formed on the wiring layer 31. In this case, when a wiring is connected to the pad (wiring layer 31) and extended in the planar direction, the wiring layer 31 is effectively used. This increases the degree of freedom for designing the uppermost wiring layers 23, 31.

Fourth Embodiment

A fourth embodiment will now be described with reference to FIGS. 10A to 11D. The fourth embodiment differs from the third embodiment in the method for manufacturing the wiring substrate 20A. Here, the description will focus on the differences from other embodiments. The same reference characters are given to those components that are the same as the corresponding components illustrated in FIGS. 1 to 9C. Such components will not be described in detail.

Figure 10A:
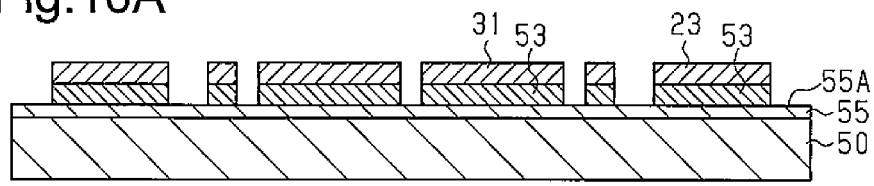
FIGS. 10A to 10D and 11A to 11D are schematic cross-sectional views illustrating steps for manufacturing a fourth embodiment of a wiring substrate.

In a step illustrated in FIG. 10A, which is performed in the same manner as the step illustrated in FIG. 5A, the metal film 55, which is formed from Cu, is formed on the support substrate 50. The metal layer 53, which is formed from Ni, and the wiring layers 23, 31, which are formed from Cu, are sequentially stacked on the first surface 55A (here, upper surface) of the metal film 55.

Figure 10B:
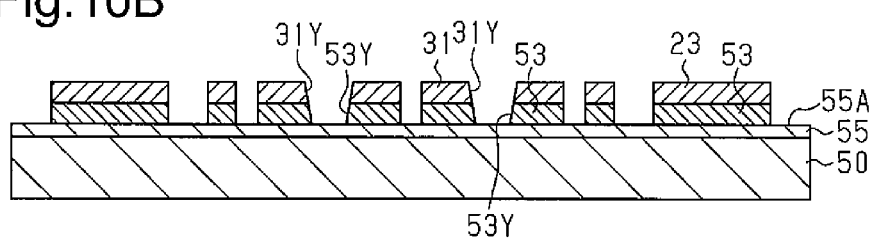

In a step illustrated in FIG. 10B, through holes 31Y are formed in predetermined portions of the wiring layer 31, and through holes 53Y are formed in predetermined portions of the metal layer 53 to partially expose the first surface 55A of the metal film 55. The through holes 31Y extend through the wiring layer 31 in the thickness-wise direction. The through holes 53Y are in communication with the corresponding through holes 31Y and extend through the metal layer 53 in the thickness-wise direction. This exposes the first surface 55A of the metal film 55 through the through holes 31Y, 53Y.

Figure 10C:
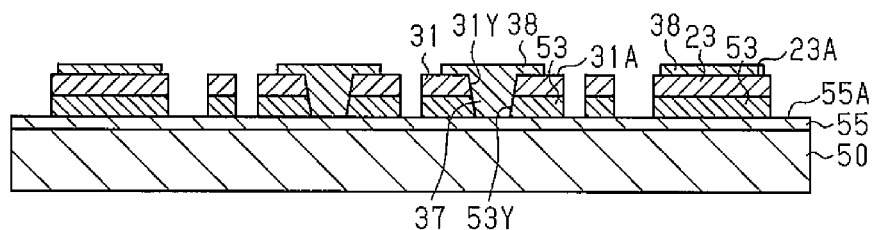

In a step illustrated in FIG. 10C, the through holes 31Y, 53Y are filled with the via conductor to form connection terminals 37. Additionally, a wiring layer 38, which is electrically connected to the connection terminals 37, is formed on the first surface 31A (here, upper surface) of the wiring layer 31. The wiring layer 38 is formed integrally with each of the connection terminals 37. The wiring layer 38 is also located on the first surface 23A (here, upper surface) of the wiring layer 23. The connection terminals 37 and the wiring layer 38 may be formed through a wiring formation process such as a semi-additive process or a subtractive process.

Figure 10D:
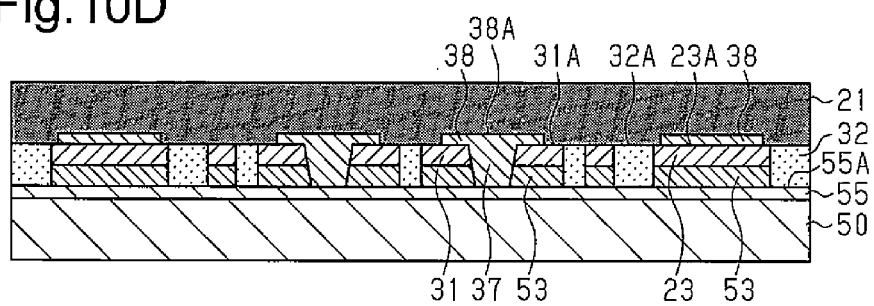

In a step illustrated in FIG. 10D, which is performed in the same manner as the step illustrated in FIG. 2C, the low viscosity insulation layer 32 is formed to cover the side surfaces of the wiring layers 23, 31 and the metal layer 53. Then, the insulation layer 21, which has a higher viscosity than the insulation layer 32, is formed on the first surface 32A (here, upper surface) of the insulation layer 32. The insulation layer 21 covers the first surface 32A of the insulation layer 32, the first surfaces 23A, 31A of the wiring layers 23, 31, and a first surface 38A (here, upper surface) and side surfaces of the wiring layer 38.

Figure 11A:
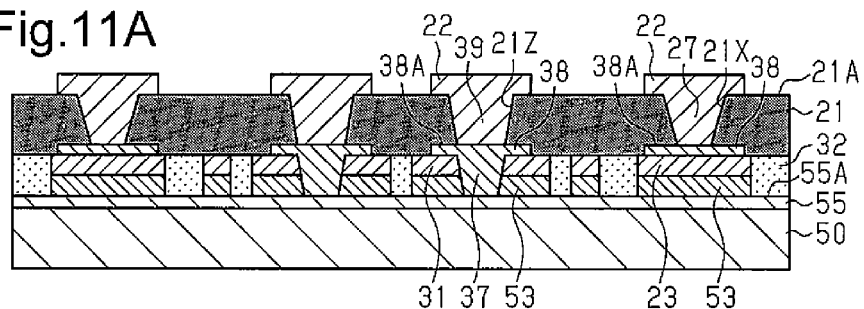

In a step illustrated in FIG. 11A, the through holes 21X are formed in the predetermined portions of the insulation layer 21 to partially expose the first surface 38A of the wiring layer 38 formed on the wiring layer 23. Additionally, the through holes 21Z are formed in the predetermined portions of the insulation layer 21 to partially expose the first surface 38A of the wiring layer 38 formed on the wiring layer 31. The through holes 21X, 21Z may be formed through a laser cutting process using, for example, a $CO_2$ laser or a YAG laser. When the insulation layer 21 is formed from a photosensitive resin, the through holes 21X, 21Z may be formed through a photolithography process.

The through holes 21X are filled with the via conductor to form the via wirings 27. At the same time, the through holes 21Z are filled with the via conductor to form via wirings 39. Additionally, the wiring layer 22 is formed on the first surface 21A of the insulation layer 21. The wiring layer 22 is formed integrally with each of the via wirings 27, 39. Thus, the wiring layer 22 is electrically connected to the wiring layer 38 and the connection terminals 37 by the via wirings 39 and also electrically connected to the wiring layer 23 by the via wirings 27. The via wirings 27, 39 and the wiring layer 22 may be formed through a wiring formation process such as a semi-additive process or a subtractive process.

Figure 11B:
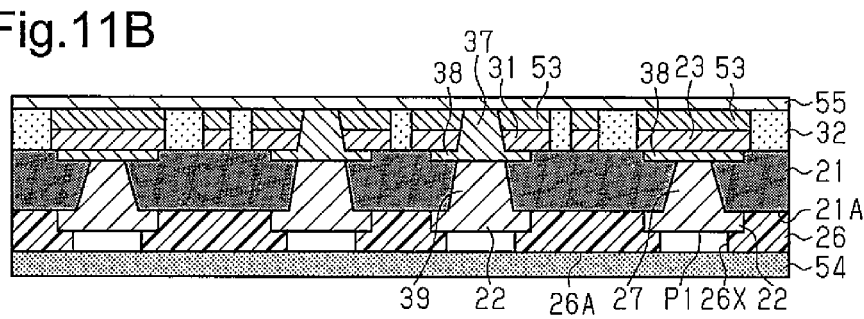

In a step illustrated in FIG. 11B, which is performed in the same manner as the step illustrated in FIG. 3B, after the solder resist layer 26 is formed on the first surface 21A of the insulation layer 21, the support substrate 50 (refer to FIG. 1) is removed. Then, in the same manner as in the step illustrated in FIG. 3C, the masking material 54 is formed to cover the first surface 26A of the solder resist layer 26.

Figure 11C:
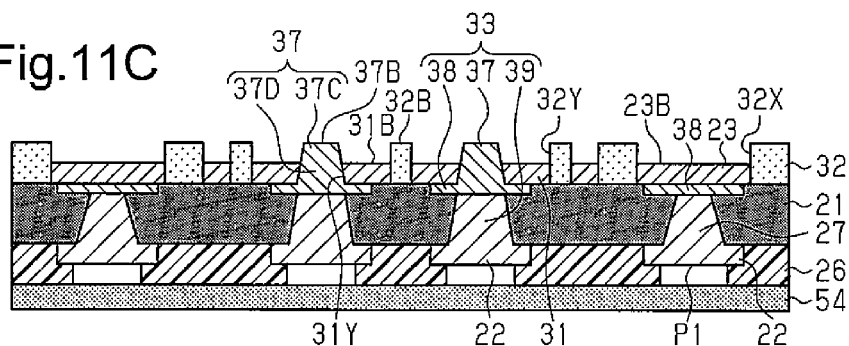

In the same manner as in the steps illustrated in FIGS. 6A to 6C, the metal film 55 is removed, and the metal layer 53 is removed. Consequently, as illustrated in FIG. 11C, the second surface 23B of the wiring layer 23 and the second surface 31B of the wiring layer 31 are exposed to the exterior. Additionally, recesses are formed by the wall surfaces defining the openings 32Y in the insulation layer 32 and the second surface 31B of the wiring layer 31. Each connection terminal 37 includes an end (here, upper end) that is located in one of the recesses and exposed to the exterior. The exposed end of the connection terminal 37 defines a bump 37C. Each bump 37C includes an upper end surface 37B, which is located above the second surfaces 23B, 31B of the wiring layers 23, 31. Each connection terminal 37 includes the bump 37C and a via wiring 37D, which extends through the wiring layer 31 in the thickness-wise direction. In the present embodiment, each connection terminal 33 includes the via wiring 39, which is formed integrally with the wiring layer 22, the wiring layer 38, and the connection terminal 37, which is formed integrally with the wiring layer 38.

Figure 11D:
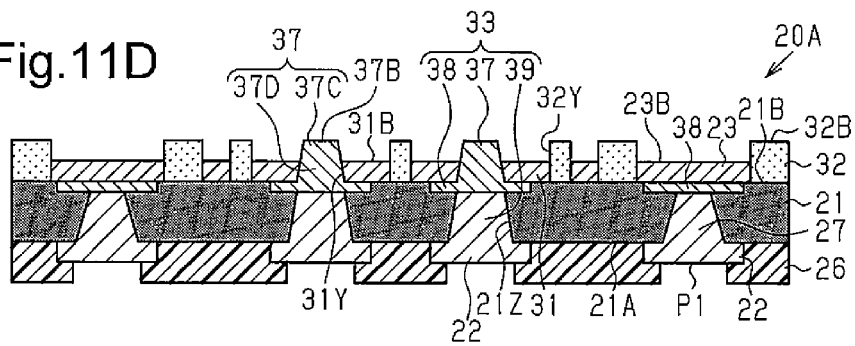

Then, the masking material 54 is removed. This forms the wiring substrate 20A of the fourth embodiment, which is illustrated in FIG. 11D. In the wiring substrate 20A, the bumps 37C respectively project from the through holes 31Y in the openings 32Y. More specifically, each bump 37C projects upward from the second surface 31B of the wiring layer 31 formed in the opening 32Y. The bump 37C is located in the opening 32Y. The side surface and the upper end surface 37B of the bump 37C are exposed to the exterior. The connection terminals 37 (bumps 37C and via wirings 37D) and the via wirings 39 are each tapered so that the diameter is decreased from the lower side (side proximate to first surface 21A of insulation layer 21) toward the upper side (side proximate to second surface 32B of insulation layer 32). The openings 32Y overlap the via wirings 39, the connection terminals 37, and the through holes 31Y, 21X in a plan view.

The fourth embodiment has the same advantages as the third embodiment.

In the fourth embodiment, the insulation layer 21 is an example of a first insulation layer, and the insulation layer 32 is an example of a second insulation layer. The wiring layer 22 is an example of a first wiring layer (further wiring layer). The wiring layer 23 is an example of a second wiring layer (first outermost wiring layer). The wiring layer 31 is an example of a third wiring layer (second outermost wiring layer). The wiring layer 38 is an example of an intermediate wiring layer. The via wirings 39 are an example of a first via wiring. The via wirings 37D are an example of a second via wiring. The through holes 21Z are an example of a first through hole (insulation layer through hole). The through holes 31Y are an example of a second through hole (wiring layer through hole). The through holes 53Y are an example of a third through hole (wiring layer through hole).

It should be apparent to those skilled in the art that the foregoing embodiments may be employed in many other specific forms without departing from the scope of the invention. Particularly, it should be understood that the foregoing embodiments may be employed in the following forms.

Figure 12A:
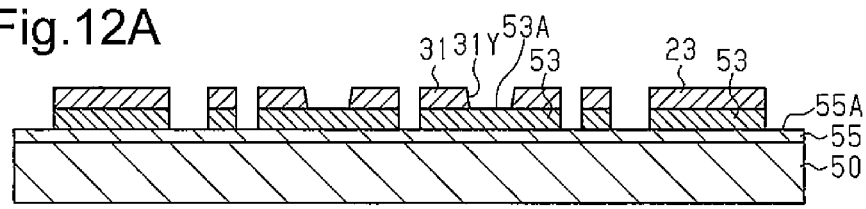
FIGS. 12A to 12C are schematic cross-sectional views illustrating steps for manufacturing a modified example of the wiring substrate of the fourth embodiment.
Figure 12B:
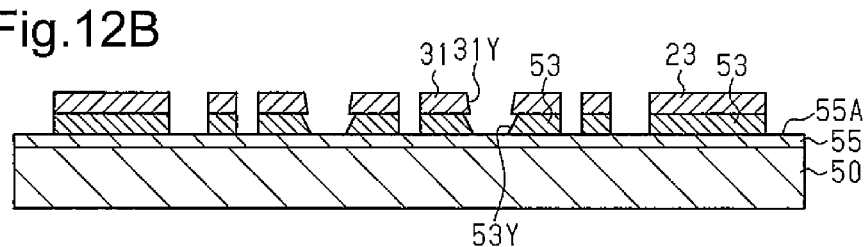
Figure 12C:
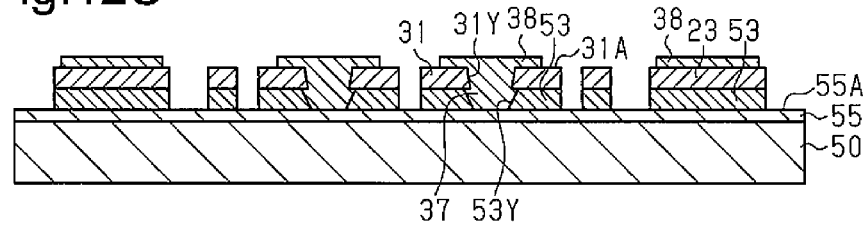

The through holes 31Y, 53Y of the fourth embodiment may be formed through the manufacturing steps illustrated in FIGS. 12A to 12C.

As illustrated in FIG. 12A, the through holes 31Y are formed in the predetermined portions of the wiring layer 31 to partially expose the first surface 53A of the metal layer 53.

The through holes 31Y may be formed through a laser cutting process using, for example, a $CO_2$ laser or a YAG laser.

In a step illustrated in FIG. 12B, the metal layer 53 is etched through the through holes 31Y, which function as a conformal mask, to form the through holes 53Y. The through holes 53Y, which are in communication with the through holes 31Y, partially expose the first surface 55A of the metal film 55. For example, when the material of the metal layer 53 is Ni, the metal layer 53 is selectively etched relative to the wiring layer 31 and the metal film 55 (Cu layer) through wet etching using a mixed solution of nitric acid and hydrogen peroxide. This forms the through holes 53Y. In this case, the metal film 55 (Cu layer) functions as an etching stopper layer. When isotropic etching is performed, an open end (in FIG. 12B, upper open end) of the through hole 53Y is wider outward than an open end (in FIG. 12B, lower open end) of the through hole 31Y due to a side etching phenomenon, in which the metal layer 53 is etched sideward. This forms an annular overhang structure, in which a portion of the wiring layer 31 including the wall surface defining the through hole 31Y projects inward above the through hole 53Y.

In a step illustrated in FIG. 12C, which is performed in the same manner as the step illustrated in FIG. 10C, the through holes 31Y, 53Y are filled with the via conductor to form the connection terminals 37. Additionally, the wiring layer 38, which is electrically connected to the connection terminals 37, is formed on the first surface 31A (here, upper surface) of the wiring layer 31.

Through the manufacturing steps, the same structural body as that illustrated in FIG. 10C may be obtained.

The wiring layer 38 (intermediate wiring layer) may be omitted from the fourth embodiment.

In each of the embodiments, the connection terminals 25, 33 are formed directly above the external connection pads P1 (e.g., refer to FIGS. 1 and 7). More specifically, in each embodiment, the wiring layer 22, which is connected to the basal ends of the connection terminals 25, 33 functions as the external connection pads P1. However, the wiring layer 22 is not limited to such a shape.

Figure 13:
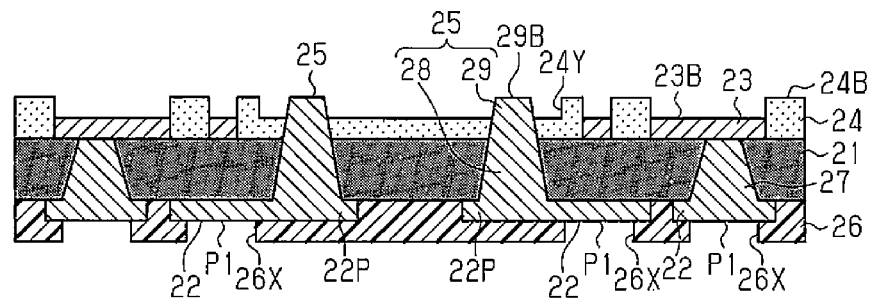
FIGS. 13 and 14 are schematic cross-sectional views illustrating a variety of modified examples of a wiring substrate.

As illustrated in FIG. 13, for example, portions of the wiring layer 22 may form pads 22P, which are connected to the basal ends of the connection terminals 25. Additionally, the external connection pads P1 may be formed by extensions of the wiring layer 22, which extend from the pads P22 in a planar direction.

Although a modified example of the wiring substrate 20 of the first embodiment is illustrated, the wiring substrates 20, 20A of the other embodiments may be modified in the same manner.

In each of the embodiments, the wiring layer 22, which is connected to the basal portions of the connection terminals 25, 33, functions as the outermost wiring layer (e.g., in FIG. 1, lowermost wiring layer). Instead, a plurality of wiring layers including the wiring layer 22 and a plurality of insulation layers may be alternately stacked on the first surface 21A of the insulation layer 21.

Figure 14:
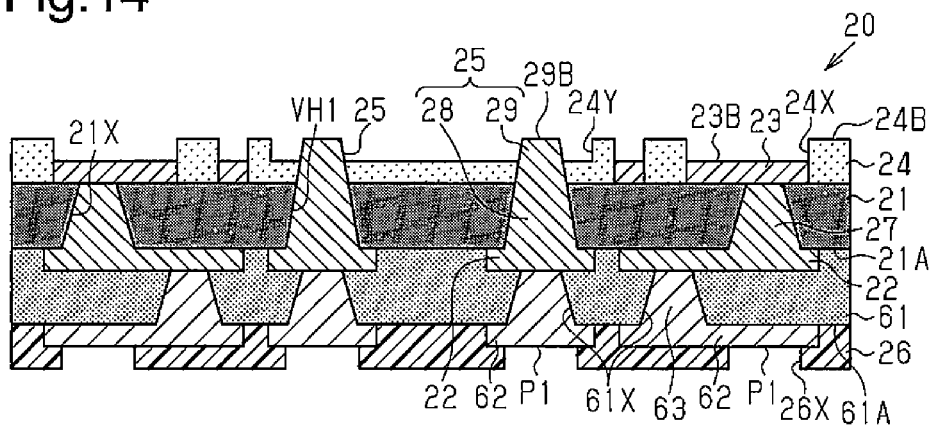

As illustrated in FIG. 14, for example, the wiring layer 22, an insulation layer 61, which covers the wiring layer 22, and a wiring layer 62, which is stacked on a first surface 61A (here, lower surface) of the insulation layer 61, may be sequentially formed on the first surface 21A of the insulation layer 21. The material of the insulation layer 61 may be, for example, the same as that of the insulation layer 21.

Through holes 61X extend through the insulation layer 61 from predetermined portions of the first surface 61A in the thickness-wise direction to partially expose a first surface (here, lower surface) of the wiring layer 22. The through holes 61X are each tapered so that the diameter is decreased from the lower side (side proximate to wiring layer 62) toward the upper side (side proximate to wiring layer 22) in FIG. 14. More specifically, in the example illustrated in FIG. 14, the through holes 21X, 61X, VH1 formed in the wiring substrate 20 are all tapered so that the lower opening is wider the upper opening.

The via wirings 63 are formed in the through holes 61X to electrically connect the wiring layer 62 and the wiring layer 22. The material of the wiring layer 62 and the via wirings 63 may be, for example, copper or an alloy of copper.

The solder resist layer 26, which includes the openings 26X exposing portions of the wiring layer 62 as the external connection pads P1, is formed on the first surface 61A of the insulation layer 61.

Although a modified example of the wiring substrate 20 of the first embodiment is illustrated, the wiring substrates 20, 20A of the other embodiments may be modified in the same manner.

In each of the embodiments, the insulation layer 21 includes the first surface 21A, on which the wiring layer 22 is formed, and the second surface 21B, on which the wiring layer 23 (and wiring layer 31) is formed. Additionally, the insulation layer 24 is formed on the second surface 21B of the insulation layer 21 to cover the entire side surfaces of the wiring layers 23, 31. Instead, the insulation layers 21, 24 may be a single insulation layer. The single insulation layer may cover the entire side surfaces of the wiring layers 23, 31.

Figure 15A:
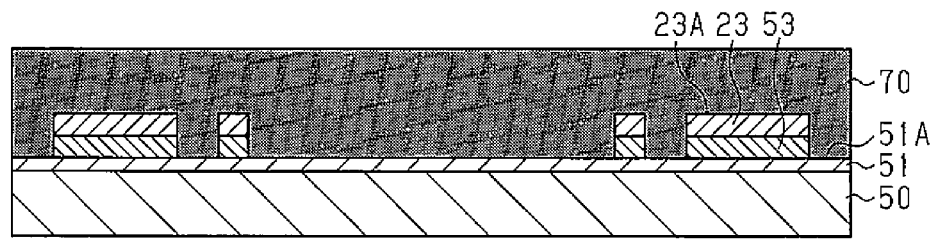
FIGS. 15A and 15B are schematic cross-sectional views illustrating steps for manufacturing a modified example of a wiring substrate.

Instead of the step illustrated in FIG. 2C, as illustrated in FIG. 15A, for example, an insulation layer 70 is formed on the first surface 51A of the metal film 51 to cover the entire side surfaces of the metal layer 53, the entire side surfaces of the wiring layer 23, and the entire first surface 23A of the wiring layer 23. The material of the insulation layer 70 may be, for example, the same as that of the insulation layer 21. Then, through the same steps as those illustrated in FIGS. 2D to 4B, a wiring substrate 20B, which is illustrated in FIG. 15B, may be manufactured.

In the wiring substrate 20B, the wiring layer 22 is formed on a first surface 70A (here, lower surface) of the insulation layer 70. Additionally, recesses 70X, 70Y are formed in a second surface 70B (here, upper surface) of the insulation layer 70. The recess 70Y corresponds to the recess 24Y of each embodiment. The wiring layer 23 is formed on a bottom surface 70C of each recess 70X. The recess 70Y overlaps the through holes VH1, which extend through the insulation layer 70 in the thickness-wise direction, in a plan view. Each connection terminal 25 includes a via wiring 28 and a bump 29, which are formed integrally with each other. Through holes VH1 are filled with the via wirings 28. The bumps 29 are projected from the through holes VH1 into the recess 70Y and exposed to the exterior. Even in this case, the upper end surfaces 29B of the bumps 29 are located above the second surface 23B of the wiring layer 23.

Although a modified example of the wiring substrate 20 of the first embodiment is illustrated, the wiring substrates 20, 20A of the other embodiments may be modified in the same manner.

Figure 15B:
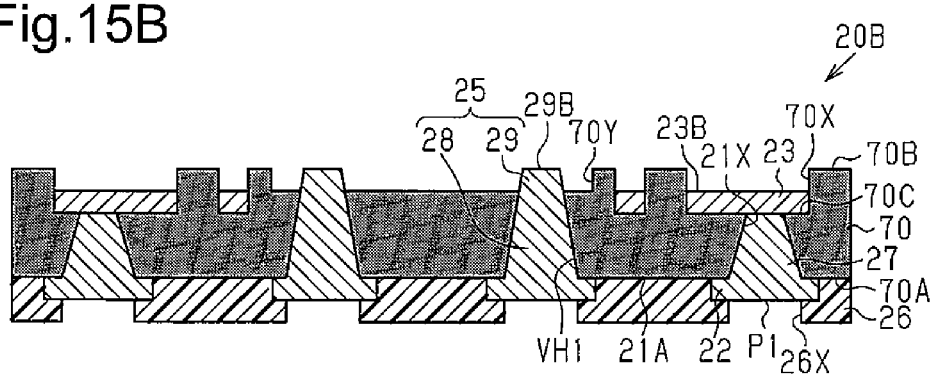

In the modified example illustrated in FIGS. 15A and 15B, the first surface 70A of the insulation layer 70 is an example of a lower surface of an insulation layer. The second surface 70B of the insulation layer 70 is an example of an upper surface of the insulation layer. The bottom surface 70C of the recess 70X is an example of an intermediate surface of the insulation layer.

In each of the embodiments and modified examples, the wiring substrates 20, 20A, 20B may include a solder resist layer formed on the second surfaces 24B, 32B, 70B of the insulation layers 24, 32, 70.

Figure 16A:
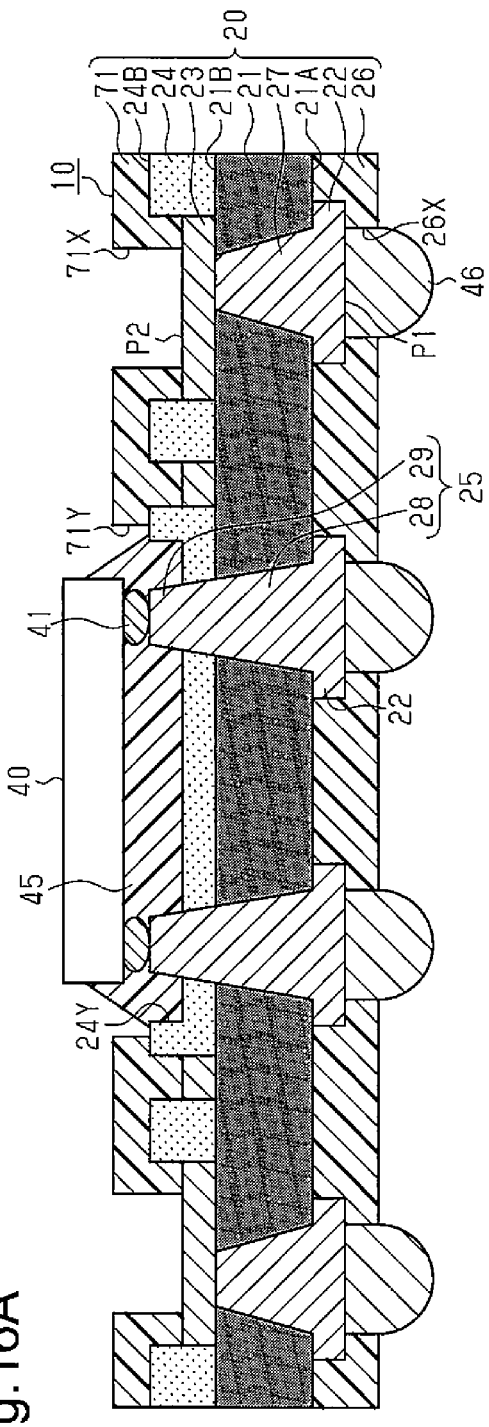
FIGS. 16A and 16B are schematic cross-sectional views illustrating another modified example of a wiring substrate (FIG. 16B is a partially enlarged cross-sectional view of FIG. 16A)

As illustrated in FIG. 16A, for example, a solder resist layer 71 may be formed on the second surface 24B (here, upper surface) of the insulation layer 24 to cover the wiring layer 23. The solder resist layer 71 includes openings 71X, which expose portions of the wiring layer 23 (uppermost wiring layer) as connection pads P2. The connection pads P2 are electrically connected to, for example, another wiring substrate or another semiconductor device. If necessary, a surface-processed layer may be formed on the wiring layer 23 exposed from the openings 71X. The solder resist layer 71 also includes an opening 71Y, which exposes the insulation layer 24 and the bumps 29 that are located in the region where the semiconductor element 40 is mounted.

Figure 16C:
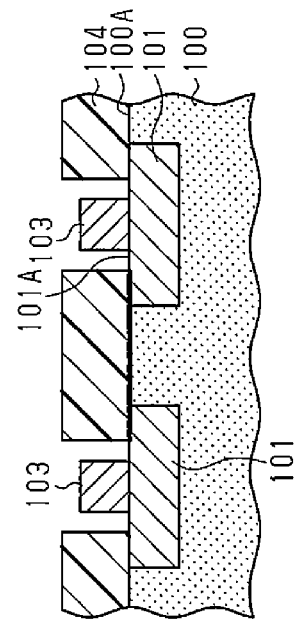
FIG. 16C is a schematic cross-sectional view illustrating shortcomings of a wiring substrate in a related art.

As illustrated in FIG. 16C, in the wiring substrate of a related art, a solder resist layer 104 is formed around the bumps 103 to protect the bumps 103 from external force such as contact force before a semiconductor element is mounted. The bonding interface between the solder resist layer 104 and the insulation layer 100 extends straight in a cross-sectional view. In this case, the bonding interface may be located between adjacent portions of the wiring layer 101 (pads). This shortens the length (refer to bold line in FIG. 16C) of the bonding interface between the adjacent portions of the wiring layer 101. Thus, migration may easily occur. This decreases the reliability in the insulation between the adjacent portions of the wiring layer 101.

Figure 16B:
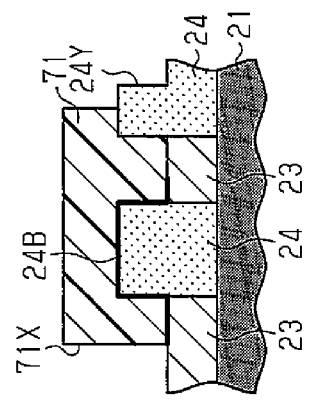

In this regard, in the substrate 20 illustrated in FIG. 16A, the insulation layer 24 is located between adjacent portions of the wiring layer 23 to cover the entire side surfaces of the wiring layer 23. Additionally, the insulation layer 24 is thicker than the wiring layer 23. Thus, as illustrated in FIG. 16B, when the solder resist layer 71 is formed on the second surface 24B of the insulation layer 24, the bonding interface extends between the solder resist layer 71 and the insulation layer 24 along the side surfaces of the insulation layer 24 and the second surface 24B of the insulation layer 24 located between the adjacent portions of the wiring layer 23. Thus, the bonding interface located between adjacent portions of the wiring layer 23 bypasses the insulation layer 24 located between the adjacent portions of the wiring layer 23. Consequently, the bonding interface between adjacent portions of the wiring layer 23 is longer than that in the related art (refer to FIG. 16C). This limits the occurrence of migration.

In the same manner, the occurrence of migration may be limited when the solder resist layer 71 is formed on the wiring substrates 20, 20A, 20B of the second to fourth embodiments and modified examples.

An example of applying the wiring substrate 20 including the solder resist layer 71 will now be described with reference to FIG. 17. Here, a semiconductor device 11 that includes a semiconductor package 12 mounted on the wiring substrate 20 will be described.

Figure 17:
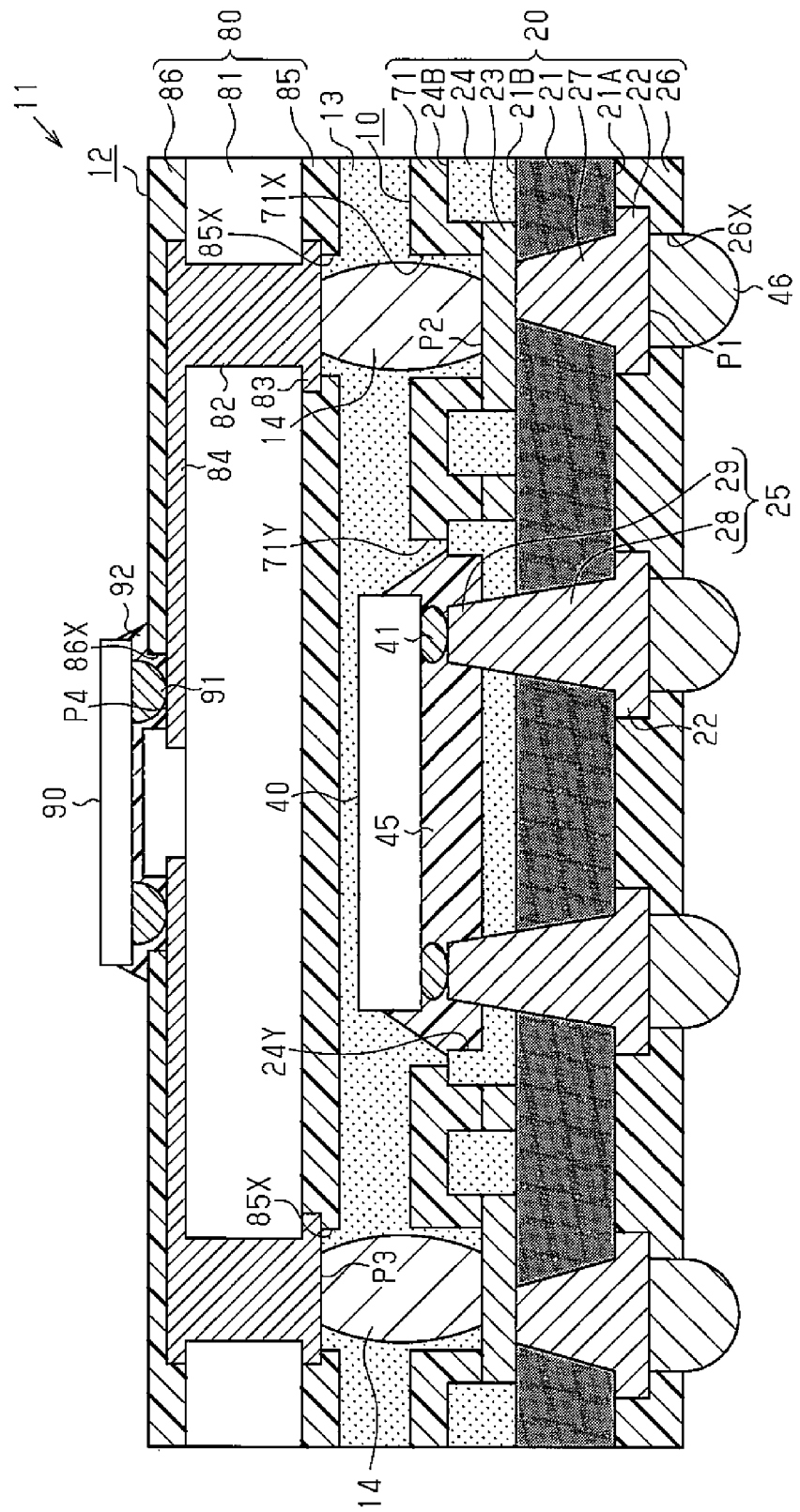
FIG. 17 is a schematic cross-sectional view illustrating an example of application of the wiring substrate illustrated in FIG. 16A.

The semiconductor device 11 includes the wiring substrate 20, which includes the solder resist layer 71, one or more semiconductor elements 40 (FIG. 17 illustrates only one) mounted on the wiring substrate 20, and the semiconductor package 12, which is stacked on and bonded to the wiring substrate 20. The semiconductor device 11 also includes an encapsulation resin 13, which is formed in a space between the wiring substrate 20 and a wiring substrate 80 of the semiconductor package 12, and the external connection terminals 46.

One example of the structure of the semiconductor package 12 will now be briefly described.

The semiconductor package 12 includes the wiring substrate 80, one or more semiconductor elements 90 (FIG. 17 illustrates only one) formed on the wiring substrate 80, and an underfill resin 92, which is formed between the wiring substrate 80 and the semiconductor element 90.

The wiring substrate 80 includes a core substrate 81, through electrodes 82, which are formed in the core substrate 81, a wiring layer 83 (here, lowermost wiring layer), which is formed on a lower surface of the core substrate 81, a wiring layer 84 (here, uppermost wiring layer), which is formed on an upper surface of the core substrate 81, and solder resist layers 85, 86. The wiring layers 83, 84 are electrically connected by the through electrodes 82.

The solder resist layer 85 is stacked on the lower surface of the core substrate 81 to partially cover the wiring layer 83. The solder resist layer 85 includes openings 85X, which expose portions of the wiring layer 83 as connection pads P3. The connection pads P3 are electrically connected to the connection pads P2 of the wiring substrate 20 and faced toward the connection pads P2.

The solder resist layer 86 is stacked on the upper surface of the core substrate 81 to partially cover the wiring layer 84. The solder resist layer 86 includes an opening 86X, which exposes portions of the wiring layer 84 as pads P4. The pads P4 function as electronic component mounting pads, which are electrically connected to an electronic component such as a semiconductor chip or a passive component.

The wiring substrate 80 is not limited to the wiring substrate including the core substrate 81 and may be a coreless substrate, which does not include the core substrate 81.

The semiconductor element 90 is flip-chip-mounted on the wiring substrate 80. In this example, bumps 91, which are arranged on a circuit formation surface (here, lower surface) of the semiconductor element 90, are bonded to the pads P4. Thus, the semiconductor element 90 and the wiring layer 84 are electrically connected by the bumps 91. The underfill resin 92 is formed in a space between the flip-chip-bonded wiring substrate 80 and semiconductor element 90.

Solder balls 14 are arranged on the connection pads P2 of the wiring substrate 20. The solder balls 14 are located between the wiring substrate 20 and the semiconductor package 12 and bonded to the connection pads P2, P3. The solder balls 14 may each be, for example, a conductive core ball (copper core ball) or a soldered resin core ball, in which a resin core ball is covered by solder.

The wiring substrate 20 and the semiconductor package 12 are stacked and bonded having the solder balls 14 located in between. This forms the semiconductor device 11 having a package on package (POP) structure.

A space between the wiring substrate 20 and the wiring substrate 80 is filled with an encapsulation resin 13. The encapsulation resin 13 fixes the wiring substrate 80 to the wiring substrate 20 and also encapsulates the semiconductor element 40 mounted on the wiring substrate 20. More specifically, the encapsulation resin 13 functions as an adhesive that bonds the wiring substrate 20 and the wiring substrate 80 and as a protection layer that protects the semiconductor element 40.

In each of the embodiments and modified examples, the bumps 29, 35, 37C are each tapered from a side proximate to the wiring layer 22 toward a side proximate to the second surfaces 24B, 32B of the insulation layers 24, 32. Instead, the bumps 29, 35, 37C may be, for example, rod-shaped such as round rod-shaped or polygonal rod-shaped.

In each of the embodiments and modified examples, the shape of the through holes formed in the wiring substrates 20, 20A, 20B is not particularly limited. The through holes formed in the wiring substrates 20, 20A, 20B may each extend straight and have a uniform diameter to be rectangular in a cross-sectional view.

CLAUSES

This disclosure encompasses the following embodiments.

1. A method for manufacturing a wiring substrate, the method including:
preparing a support body;
stacking a metal layer on the support body;
stacking an outermost wiring layer on the metal layer;
forming an insulation layer on the support body, wherein the insulation layer covers the metal layer and the outermost wiring layer;
forming a through hole that extends through the insulation layer in a thickness-wise direction to the support body;
forming a connection terminal that fills the through hole;
forming a further wiring layer on the insulation layer, wherein the further wiring layer is formed integrally with the connection terminal;
at least partially removing the support body to expose at least a portion of the insulation layer; and
forming a recess in the exposed portion of the insulation layer to expose an end of the connection terminal to the exterior in the recess.

2. The method according to clause 1, wherein:
the support body includes a support substrate and a metal film, which is formed on the support substrate;
the at least partially removing the support body includes:
removing the support substrate; and
partially removing the metal film to form an opening that exposes a portion of the insulation layer; and
the forming a recess includes:
forming the recess by thinning the exposed portion of the insulation layer, which is exposed in the opening of the metal film;
removing a remaining portion of the metal film; and
removing the metal layer.

3. The method according to clause 1, wherein:
the stacking an outermost wiring layer on the metal layer includes stacking the outermost wiring layer, which serves as a first outermost wiring layer, and a second outermost wiring layer on the metal layer;
the first outermost wiring layer and the second outermost wiring layer are located in the same layer;
the insulation layer covers the metal layer, the first outermost wiring layer, and the second outermost wiring layer;
the forming a through hole includes forming a first through hole, which extends through the insulation layer in the thickness-wise direction, a second through hole, which is in communication with the first through hole and extends through the second outermost wiring layer in the thickness-wise direction, and a third through hole, which is in communication with the second through hole and extends through the metal layer in the thickness-wise direction; and
the forming a recess includes forming the recess by removing the support body and the metal layer.

4. A method for manufacturing a wiring substrate, the method including:
preparing a support body;
stacking a metal layer on the support body;
stacking a first outermost wiring layer and a second outermost wiring layer on the metal layer, wherein the first outermost wiring layer and the second outermost wiring layer are located in the same layer;
forming a wiring layer through hole that continuously extends through the second outermost wiring layer and the metal layer in a thickness-wise direction to expose the support body;
forming a connection terminal that fills the wiring layer through hole;
forming an intermediate wiring layer on the second outermost wiring layer;
forming an insulation layer that covers the metal layer, the first outermost wiring layer, the second outermost wiring layer, and the intermediate wiring layer;
forming an insulation layer through hole that extends through the insulation layer in the thickness-wise direction to expose the intermediate wiring layer;
forming a first via wiring that fills the insulation layer through hole;
forming a further wiring layer on the insulation layer, wherein the further wiring layer is formed integrally with the first via wiring;
exposing a surface of the insulation layer by removing the support body; and
forming a recess in the exposed surface of the insulation layer by removing the metal layer so that an end of the connection terminal is exposed to the exterior in the recess.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to an illustration of the superiority and inferiority of the invention. Although embodiments have been described in detail, it should be understood that various changes, substitutions, and alterations could be made hereto without departing from the spirit and scope of the invention.

The invention claimed is:

1. A wiring substrate comprising:
an insulation layer including a first insulation layer and a second insulation layer, wherein the first insulation layer includes a lower surface and an upper surface that defines an intermediate surface, and the second insulation layer is stacked on the upper surface of the first insulation layer;
a first wiring layer formed on the lower surface of the first insulation layer;
a second wiring layer formed on the intermediate surface of the first insulation layer, wherein the second wiring layer serves as an uppermost wiring layer;
a recess formed in the second insulation layer;
a first through hole that extends through at least the first insulation layer in a thickness-wise direction, wherein the recess overlaps the first through hole in a plan view;
a connection terminal including a via wiring and a bump, wherein the via wiring is formed integrally with the first wiring layer, the first through hole is filled with the via wiring, the bump is formed integrally with the via wiring, the bump is projected into the recess and exposed to the exterior, and the bump is surrounded by a wall of the recess with the bump spaced from the wall of the recess; and a third wiring layer formed on a bottom surface of the recess and including a second through hole, wherein the second through hole extends through the third wiring layer in the thickness-wise direction and is in communication with the first through hole, wherein an upper end surface of the bump is located above an upper surface of the second wiring layer, the second insulation layer entirely contacts and covers a side surface of the second wiring layer and is thicker than the second wiring layer, the via wiring is not in contact with the second wiring layer, an upper surface of the second insulation layer is located above the bottom surface of the recess of the second insulation layer, the upper end surface of the bump and the upper surface of the second insulation layer are coplanar, the first through hole and the second through hole are filled with the via wiring, and the bump projects upward from an upper surface of the third wiring layer.

2. The wiring substrate according to claim 1, wherein the recess is formed in an upper surface of the second insulation layer, and the bump projects into the recess from the first through hole, which extends through the first insulation layer and the second insulation layer in the thickness-wise direction.

3. The wiring substrate according to claim 1, wherein the bump is tapered toward the upper end surface of the bump.

4. The wiring substrate according to claim 1, wherein a side surface of the via wiring and a side surface of the bump are continuous and linear in a cross-sectional view.

5. A semiconductor device comprising:
the wiring substrate according to claim 1; and
a semiconductor element flip-chip-bonded to the bump.

6. A wiring substrate comprising:
an insulation layer including a first insulation layer and a second insulation layer, wherein the first insulation layer includes a lower surface and an upper surface that defines an intermediate surface, and the second insulation layer is stacked on the upper surface of the first insulation layer;
a first wiring layer formed on the lower surface of the first insulation layer;
a second wiring layer formed on the intermediate surface of the first insulation layer, wherein the second wiring layer serves as an uppermost wiring layer;
a recess formed in the second insulation layer;
a third wiring layer formed on a bottom surface of the recess;
a first through hole that extends through the first insulation layer in a thickness-wise direction, wherein the recess overlaps the first through hole in a plan view;
a second through hole that extends through the third wiring layer in the thickness-wise direction, wherein the second through hole overlaps the first through hole in a plan view;
a first via wiring formed integrally with the first wiring layer, wherein the first through hole is filled with the first via wiring;
a connection terminal including a second via wiring and a bump that are formed integrally with each other, wherein the second via wiring is electrically connected to the first via wiring, the second through hole is filled with the second via wiring, the bump is projected upward from an upper surface of the third wiring layer into the recess and exposed to the exterior, and the bump is surrounded by a wall of the recess with the bump spaced from the wall of the recess, wherein an upper end surface of the bump is located above an upper surface of the second wiring layer, the second insulation layer entirely contacts and covers a side surface of the second wiring layer and is thicker than the second wiring layer, the first via wiring and the second via wiring are not in contact with the second wiring layer, an upper surface of the second insulation layer is located above a bottom surface of the recess of the second insulation layer, and the upper end surface of the bump and the upper surface of the second insulation layer are coplanar.

7. The wiring substrate according to claim 6, wherein the bump is tapered toward the upper end surface of the bump.

8. The wiring substrate according to claim 6, wherein a side surface of the second via wiring and a side surface of the bump are continuous and linear in a cross-sectional view.

9. A semiconductor device comprising:
the wiring substrate according to claim 6; and
a semiconductor element flip-chip-bonded to the bump.

10. A wiring substrate comprising:
an insulation layer including a lower surface, an upper surface, and an intermediate surface located between the lower surface and the upper surface;
a first wiring layer formed on the lower surface of the insulation layer;
a second wiring layer formed on the intermediate surface of the insulation layer, wherein the second wiring layer serves as an uppermost wiring layer;
a recess formed in the upper surface of the insulation layer;
a first through hole that extends through the insulation layer in a thickness-wise direction, wherein the recess overlaps the first through hole in a plan view;
a connection terminal including a via wiring and a bump, wherein the via wiring is formed integrally with the first wiring layer, the first through hole is filled with the via wiring, the bump is formed integrally with the via wiring, the bump is projected into the recess and exposed to the exterior, and the bump is surrounded by a wall of the recess with the bump spaced from the wall of the recess; and
a third wiring layer formed on a bottom surface of the recess and including a second through hole, wherein the second through hole extends through the third wiring layer in the thickness-wise direction and is in communication with the first through hole, wherein an upper end surface of the bump is located above an upper surface of the second wiring layer, the via wiring is not in contact with the second wiring layer, an upper surface of the insulation layer is located above the bottom surface of the recess of the insulation layer, the upper end surface of the bump and the upper surface of the insulation layer are coplanar, the first through hole and the second through hole are filled with the via wiring, and the bump projects upward from an upper surface of the third wiring layer.

* * * * *

UNITED STATES PATENT AND TRADEMARK OFFICE
CERTIFICATE OF CORRECTION

PATENT NO. : 9,966,331 B2  
APPLICATION NO. : 15/056515  
DATED : May 8, 2018  
INVENTOR(S) : Ota et al.

Page 1 of 1

It is certified that error appears in the above-identified patent and that said Letters Patent is hereby corrected as shown below:

On the Title Page

Column 1 (Notice), Line 3, after "0 days." delete "days.".

Signed and Sealed this  
Tenth Day of July, 2018

Andrei Iancu  
*Director of the United States Patent and Trademark Office*